US006438569B1

(12) United States Patent
Abbott

(10) Patent No.: US 6,438,569 B1
(45) Date of Patent: Aug. 20, 2002

(54) SUMS OF PRODUCTION DATAPATH

(75) Inventor: Curtis Abbott, Menlo Park, CA (US)

(73) Assignee: PMC-Sierra, Inc., Burnaby (CA)

( * ) Notice: Subject to any disclaimer, the term of this patent is extended or adjusted under 35 U.S.C. 154(b) by 0 days.

(21) Appl. No.: 09/399,981

(22) Filed: Sep. 20, 1999

(51) Int. Cl.[7] ............................................. G06F 17/10
(52) U.S. Cl. ................................................... 708/603
(58) Field of Search ..................... 708/603, 523, 708/501, 319

(56) References Cited

U.S. PATENT DOCUMENTS

| | | | |
|---|---|---|---|
| 3,980,992 A | 9/1976 | Levy et al. ............... | 340/172.5 |
| 4,558,411 A | 12/1985 | Faber et al. ................ | 364/200 |
| 4,791,602 A | 12/1988 | Resnick ...................... | 364/900 |
| 4,791,603 A | 12/1988 | Henry ......................... | 364/900 |
| 4,821,183 A | 4/1989 | Hauris ........................ | 364/200 |
| 4,823,286 A | 4/1989 | Lumelsky et al. .......... | 364/521 |
| 4,992,680 A | 2/1991 | Benedetti et al. ........... | 307/465 |
| 5,055,712 A | 10/1991 | Hawley et al. ............. | 307/465 |
| 5,175,862 A | 12/1992 | Phelps et al. ............... | 395/800 |
| 5,185,706 A | 2/1993 | Agrawal et al. ............. | 364/489 |

OTHER PUBLICATIONS

International Search Report, Int'l Appln PCT/US98/11889, mailed Oct. 23, 1998, 5 pgs.
C.S. Wallace, "A Suggestion for a Fast Multiplier," IEEE Transaction son Electronic Computers, Feb. 1964, pp. 14–17.
Charles R. Baugh and Bruce A. Wooley, "A Two's Complement Parallel Array Multiplication Algorithm," IEEE Transactions on Computers, vol. C–22, No. 12, Dec. 1973, pp. 1045–1047.
Earl E. Swartzlander, Jr. "Merged Arithmetic," IEEE Transactions on Computers, vol. C–5, No. 10, Oct. 1980, pp. 946–950.
Michael Bolotski, Andre DeHon, and Thomas F. Knight, Jr., Transit Note #95 *Unifying FPGAs and SIMD Arrays,* Mit Transit Project, Sep. 1993, 14 pps.

(List continued on next page.)

*Primary Examiner*—David H. Malzahn
(74) *Attorney, Agent, or Firm*—Blakely, Sokoloff, Taylor & Zafman LLP

(57) ABSTRACT

A method and apparatus for a sums of products datapath. According to one embodiment of the invention, an apparatus has a number of inputs and a number generation units. Each of the generation units is coupled to the inputs. Each of the generation units includes a separate selection circuit coupled to each one of the inputs to selectively pass the signal provided on that input. In addition, each of the generation units includes a number of reduction circuits having inputs coupled to mutually exclusive pluralities of the selection circuits and each having an output. The apparatus also includes a first and second summation circuit coupled to the output of the plurality of reduction circuits in mutually exclusive pluralities of generation units. Additionally, the apparatus includes a subtraction circuit coupled to an output of the first and second summation circuit.

46 Claims, 19 Drawing Sheets

U.S. PATENT DOCUMENTS

| | | | |
|---|---|---|---|
| 5,220,213 A | 6/1993 | Chan et al. | 307/465 |
| 5,231,588 A | 7/1993 | Agrawal et al. | 364/489 |
| 5,321,845 A | 6/1994 | Sawase et al. | 395/800.37 |
| 5,446,651 A | 8/1995 | Moyse et al. | 364/760 |
| 5,619,668 A | 4/1997 | Zaidi | 395/376 |
| 5,751,619 A | 5/1998 | Agrawal et al. | 364/736.02 |
| 5,930,160 A | 7/1999 | Mahant-Shetti | 708/603 |
| 5,974,435 A | 10/1999 | Abbott | 708/553 |
| 6,085,213 A | 7/2000 | Oberman et al. | 708/603 |
| 6,212,618 B1 | 4/2001 | Roussel | 708/603 |
| 6,247,036 B1 | 6/2001 | Landers et al. | 708/603 |

OTHER PUBLICATIONS

Debabrata Ghosh, et al., "Architectural Synthesis of Performance–Driven Multipliers with accumulator Interleaving", 30th ACM/IEEE Design Automation Comference, (1993) pp. 303–307.

Andre DeHon, Transit Note #118 Notes on Coupling Processors with Reconfigurable Logic, MIT, pp. 1–40.

Andre DeHon, Reconfigurable Architectures for General–Purpose Computing, 258 pps.

PCT Written Opinion, Int'l Appln PCT/US98/11889, mailed Jun. 01, 1999, 6 pps.

SUMS OF PRODUCTION DATAPATH

CROSS-REFERENCE TO RELATED APPLICATIONS

This application contains subject matter related to: non-provisional application Ser. No. 08/953,766, filed Oct. 17, 1997, now U.S. Pat. No. 5,974,435, entitled "A RECONFIGURABLE ARITHMETIC DATAPATH," to Curtis Abbott, which is a continuation of provisional application No. 60/057,156, filed Aug. 28, 1997; non-provisional application Ser. No. 09/346,556, filed Jun. 30, 1999, now U.S. Pat. No. 6,150,836, entitled "A MULTILEVEL LOGIC FIELD PROGRAMMABLE DEVICE," to Curtis Abbott, which is a continuation-in-part of non-provisional application Ser. No. 08/874,817, filed Jun. 13, 1997, now U.S. Pat. No. 6,006,321 entitled "PROGRAMMABLE LOGIC DATAPATH THAT MAY BE USED IN A FIELD PROGRAMMABLE DEVICE," to Curtis Abbott.

BACKGROUND OF THE INVENTION

1. Field of the Invention

The invention relates to the field of logic devices. More specifically, the invention relates to the field of programmable logic devices.

2. Background Information

Fast multiplication and addition are key arithmetic operations in digital signal processing (DSP), as well as other forms of computer data processing. In DSP especially, it is often necessary to multiply several pairs of numbers and accumulate the results by addition into a single number. Mathematically, this operation is called a "dot product" or "sum of products." It can be written $a_1*b_1+a_2*b_2+ \ldots +a_n*b_n$, where the $a_i$ and $b_i$ sequences are paired up, and each corresponding element is multiplied, with the results accumulated. In a typical digital filter, the first sequence may be a fixed sequence of filter coefficients, while the second sequence may be a contiguous set of data samples from a longer input sequence.

Some application-specific examples of constant coefficient sums of products over low resolution data include: multi-tap constant coefficient FIR filters such as pulse shaping filters, especially over low precision data; fixed-pattern correlators (matched filters), despreaders, etc. Other applications that involve higher precision data include: fast block transforms, such as DCT, FFT, wavelets, etc.; IP checksums (reduction of 64 bits/cycle in the main body of an IP packet), etc.

The precision requirements for these multiplication and addition operations can vary tremendously, as can the desired representations of the numbers involved. For example, in some applications it is desired to use floating point number representations; in others, the fixed point representation is sufficient and is more cost effective. Among fixed point representations, the number of integral and fractional digits can vary, as can the total number of digits. Additionally, the numbers may be signed or unsigned. Beyond the data representations themselves, certain details of the processing operations are important. For example, multiplication and addition operations produce outputs with a greater number of digits than their inputs. Thus, when such operations are composed, the number of digits in the results can grow dramatically. Commonly, the exact results include digits that do not represent useful information, so some digits are discarded using truncation and rounding. The art of discarding digits that are not useful is both important and complex.

The precision requirements for the multiplication and addition operations are generally related to: the precision of the input data; the precision of the coefficients; the type of processing algorithm; and certain parameters of that algorithm such as how truncation and rounding are performed. The analysis of these requirements is sufficiently complex that a whole branch of mathematics, known as Numerical Analysis, has been developed for them.

In response to the widespread need for fast multiplication and addition with a variety of precisions and data representations, an extensive literature has been created and many hardware and software implementations have been developed. For most implementations, the complexity increases roughly as $N*M$ where N and M are the number of bits of the two input operands. Thus, for N by N multiplication, the complexity increases as $N^2$. Algorithms are known that reduce this complexity for very large operands, but for most applications, the operand sizes are not large enough to make these algorithms practically useful. On the other hand, many ideas have been developed that do effectively exploit properties of hardware technologies and multiplication algorithms to speed up implementations having a particular precision and numerical representation.

The straightforward approach to multiplication is adding up a set of appropriately shifted partial products, each generated by multiplying the multiplicand by one of the digits of the multiplier. The only difficulty about addition is carries between digits, since the carry out from a particular digit depends on the carry into that digit, so that the carry propagation aspect of addition is inherently sequential. Since it is possible that a carry may propagate across all the digits of a sum, the number of sequential steps required for the addition is equal to the number of digits being added. Many techniques are known for reducing the maximum number of sequential steps requires for the addition; however these techniques generally require more hardware.

Many hardware designs for fast multiplication embody an extended version of the straightforward multiplication algorithm, consisting of a first part that generates partial products, a second part that sums the partial products to two numbers (referred to as "carry" or "C" and "save" or "S") whose sum is the correct answer, and a third part that adds together C and S to produce the answer. The partial product generation may include any form of multiplicand preprocessing, such as Booth encoding. The numbers C and S are developed in such a way that carry propagation is largely or completely avoided during the second part. The apparatus implementing the second part is generally known as a "Carry Save Adder," sometimes abbreviated "CSA." Carry propagation is unavoidable during the third part of the multiplication algorithm, but only two numbers are then involved, and any of the known techniques can be used to speed up the addition. The third part of this multiplication algorithm is also called the "Carry Propagate Adder," sometimes abbreviated "CPA".

The variations among hardware multiplier designs of this type generally involve one or more of the following: the method for generating partial products, the method for reducing them to numbers C and S, the method for performing the final addition of numbers C and S, and the method for modifying the partial products and/or carry save adder to accommodate signed number representations.

More generally, systems applications may use several of the DSP algorithms that were just briefly described, and may use other algorithms involving multiplications and additions as well. Depending on the total throughput required by the application, it may be necessary to provide dedicated hardware multiplication and addition circuits for each operation through which data flows in fixed connection patterns, or on the other hand, it may be possible to reuse one or more hardware multiplication and addition circuits with data flows directed by a control element.

When designing dedicated hardware for performing sums of products, the hardware designer will exploit certain simplifications resulting from zero bits in the (constant) coefficients. A designer/architect will use other techniques to minimize the number of non-zero bits in the coefficients. For example, with 1-bit data interpreted as 1 and −1, an FIR filter reduces to adding and subtracting the coefficients according to the state of each data bit. The result is that multiplications involving constant coefficients are much more efficient in dedicated hardware as opposed to "general purpose" multiplication hardware. However, programmable CPU and DSP hardware typically provides only general purpose multiplies.

In particular, CPU and DSP circuits usually implement complex numerical algorithms by the sequential composition of simpler operations into and out of register files that store intermediate results, coefficients, and so on. For example, a sum of squares of differences algorithm may be implemented by a first operation that takes the difference of two numbers, a second operation that squares the result, and a third operation that accumulates the result of the second operation into a running sum. In case each operation takes a single cycle, the algorithm would then be completed in 3 cycles.

However, since the inherent complexity of multiplication is higher than that of addition or subtraction, hardware designers often optimize the clock speed of their designs by pipelining the multiplication operation, so that it completes after more than one cycle. For example, a particular design might complete in 3 cycles but allow a new multiply operation to be started on every cycle. In such a case, the sum of squares of differences algorithm discussed earlier might complete in 5 cycles. Depending on certain details of the hardware design, it might be possible to overlap the calculation for the next pair of vector elements so that on average, each pair of elements would be subtracted, squared, and summed in 3 cycles.

While many design variations are possible that involve more or less parallel hardware, it is generally desirable for designs to require as few cycles as possible to complete an algorithm; this is especially important for the most widely used algorithms, including those mentioned in the foregoing. If a first design uses K cycles while a second uses L>K, then the first design is also more cost-effective if it uses less than L/K as much hardware. Implementers of systems applications are generally desirous of designs that are fast, cost-effective, and reconfigurable.

SUMMARY OF THE INVENTION

A method and apparatus for a sums of products datapath is described. According to one embodiment of the invention, an apparatus has a number of inputs and a number generation units. Each of the generation units is coupled to the inputs. Each of the generation units includes a separate selection circuit coupled to each one of the inputs to selectively pass the signal provided on that input. In addition, each of the generation units includes a number of reduction circuits having inputs coupled to mutually exclusive pluralities of the selection circuits and each having an output. The apparatus also includes a first and second summation circuit coupled to the output of the plurality of reduction circuits in mutually exclusive pluralities of generation units. Additionally, the apparatus includes a subtraction circuit coupled to an output of the first and second summation circuit.

DETAILED DESCRIPTION

In the following description, numerous specific details are set forth to provide a thorough understanding of the invention. However, it is understood that the invention may be practiced without these specific details. In other instances, well-known circuits, structures and techniques have not been shown in detail to avoid obscuring the invention.

Sums of Products Datapath

Figure 1A:
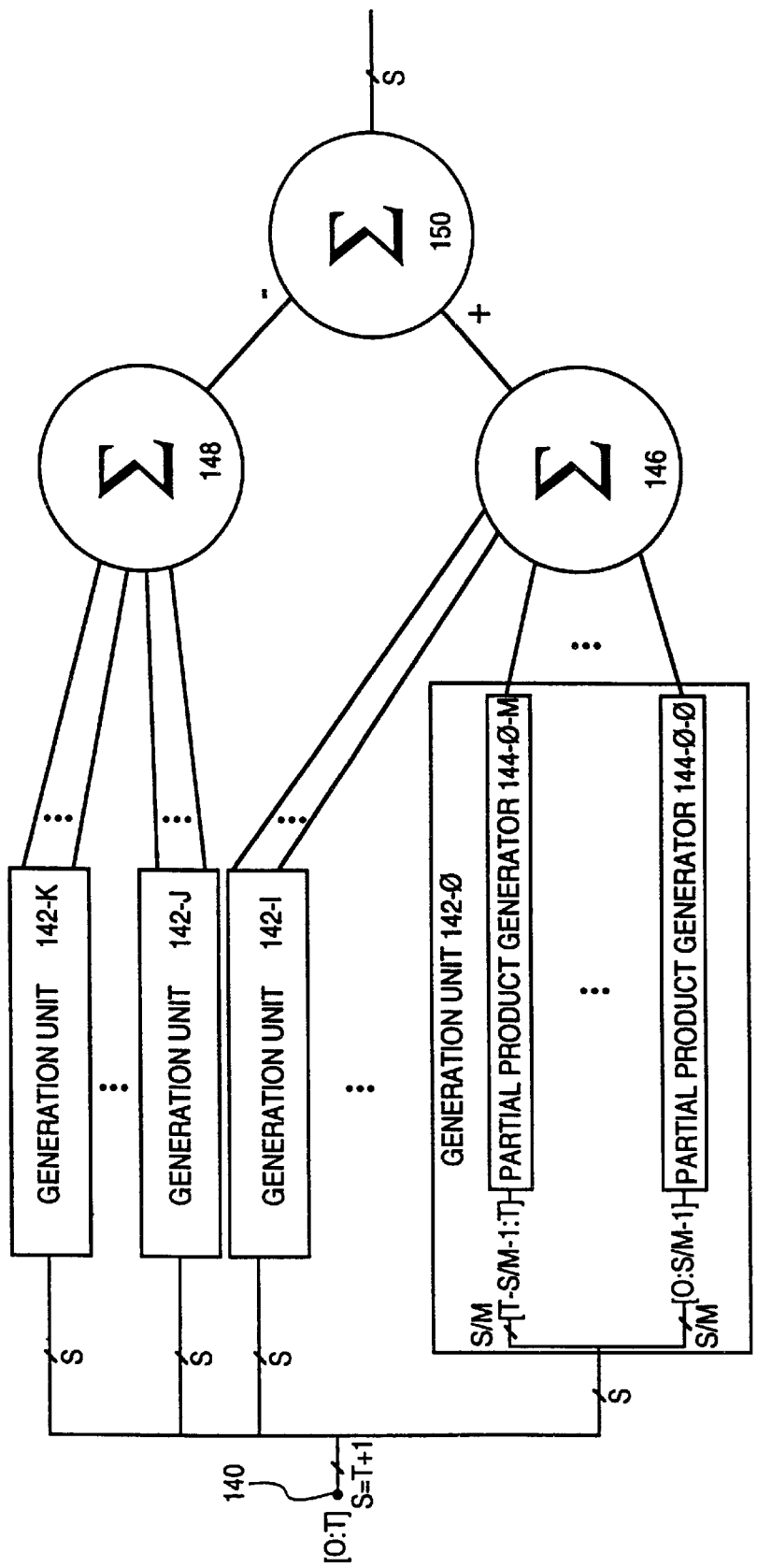
FIG. 1A is a block diagram illustrating a sums of products datapath according to one embodiment of the invention.

FIG. 1A is a block diagram illustrating a sums of products datapath according to one embodiment of the invention. FIG. 1A shows data having bit positions [0:T] are provided at a set of S inputs 140 (where S=T–1). In addition, FIG. 1A shows a number of generation units 142-0 through 142-K. Each of the generation units 142 is coupled to the inputs 140. Thus, the data on the inputs 140 is duplicated for each of the generation units 142.

Each of the generation units 142 includes M partial product generators 144. For instance, the generation unit 142-0 includes the partial product generators 144-0-0 through 144-0-M. Within each generation unit, the inputs 140 are divided into mutually exclusive input groups (e.g. [0:S/M–1], . . . , {T–S/M–1:T]), one input group coupled to each of the partial product generators 144. Thus, the inputs 140 are divided into M mutually exclusive input groups, each including S/M inputs.

To provide an example, assuming that the inputs 140 are made up of 32 inputs (S=32), data bits [0:31] would be provided at the inputs 140. Each of the generation units 142 would receive the same 32 data inputs. Also assuming that each generation unit includes 8 partial product generators (M=8), the 32 data bits are divided into 8 mutually exclusive input groups, each input group including 4 inputs (S/M=32/8=4).

Data representing separate multiplicands are simultaneously provided at the inputs 140. Each of the multiplicands is to be multiplied by a separate corresponding multiplier. Although the data representing the multiplicands provided at the inputs 140 can have a number of different arrangements, it is contemplated that the data provided on a given input group may include bits from different multiplicands. In other words, certain of the partial product generators 144 may receive bits from different multiplicands. The partial product generators 144 are controlled to provide the partial products for the multiplication of the input multiplicands by the separate corresponding multipliers (thus, a given partial product generator which is not necessary for a given operation will not be delivering a partial product for that operation).

For a given partial product generator that is providing a partial product for the current operation, the partial product generator: 1) selects from the data provided on the input group which bit(s) from which multiplicand(s) is used by the partial product generator; and 2) selectively passes the selected bit(s) of the chosen multiplicand(s) based on a control input which is a function of the corresponding multiplier(s) for the chosen multiplicand(s). For instance, assume that a partial product generator receives data containing bits from both a first and second multiplicand and that the operation requires that the partial product generator provides a partial product for the multiplication of the first multiplicand by its corresponding multiplier. As such, the partial product generator would: 1) inhibit all of the data in its input group except the bit from the first multiplicand; and 2) selectively pass the bit from the first multiplicand based on a corresponding bit of the first multiplicand's corresponding multiplier. In this manner, the partial products for the multiplication of the provided multiplicands and multipliers are generated.

It should therefore be understood that the duplication of the input data to all of the generation units (and thus, the duplication of the input data to the partial product generators in each of the generation units) requires that different ones of the partial product generators be controlled to operate on different multiplicand/multiplier pairs. As such, the partial product generators that are to provide the partial products for a given multiplicand/multiplier pair must be controlled to select from the data the multiplicand they are to consider and operate on that multiplicand with the appropriate multiplier data to produce the partial products for that multiplicand/multiplier pair.

To continue this description, it should be understood that the circuit of FIG. 1 relies on the concept that $2^{n-1}+2^{n-2}+2^{n-3}=2^n-2^{n-3}$. For example, 7=4+2+1=8–1. This technique can be generalized to longer strings of consecutive 1 bits, and can be used to transform any string of consecutive 1 bits in the binary representation of a number into a pair of 1 bits, one of which is negated. When there are 3 or more consecutive 1 bits, this transformation reduces the total number of 1 bits.

This recoding technique replaces a string of positive bits with one positive and one negative bit, thereby creating negative bits. Signed coefficients and/or data also create the need for bits that are interpreted as negative. For example, an N-bit representation of a signed number in 2's complement form is as follows: $-b_{N-1}2^{N-1}+\Sigma b_i 2^i$, where i ranges from 0 to to N–2. In other words, the uppermost bit is negative; the others are positive. This recoding technique is not limited to, but is particularly useful for, the representation of constant coefficients. As such, in one embodiment of the invention the multiplier's used in the circuit of FIG. 1A are constants.

Based on the above recoding technique, the circuit of FIG. 1A includes a set of summation circuits 146, 148, and 150. The partial product generators 144 in mutually exclusive groups of the generation units 142 are coupled to the summation circuits 146 and 148 according to a predefined pattern as described later herein (e.g., in FIG. 1A the generation units 142-0 through 142-I are coupled to the summation circuit 146, while the generation units 142-J through 142-K are coupled to the summation circuit 148). The output of the summation circuits 146 and 148 are coupled to the summation circuit 150. In particular, the output of the summation circuits 146 and 148 are respectively treated as a positive and negative sum when provided to the summation circuit 150 (in other words, the summation circuit 150 acts as a subtraction circuit). The output of the summation circuit 150 is S bits representing the sum of the products for the multiplicands provided at the inputs 140 and their corresponding multipliers.

While a number of different predefined patterns could be used for coupling the generation units to the summation circuits 146 and 148, the following Table 1 illustrates the predefined pattern according to one embodiment of the invention. In particular, Table 1 defines the significance assigned to each of the partial product generators 144 in each of the generation units 142. Table 1 assumes that there are 32 inputs, 32 generation units, and 8 partial product generators per generation unit; therefore there are 4 inputs to each partial product generator.

with unsigned parts of the numbers produce rows of negative bits that are shifted up in significance. The intended way to support low precision data with this approach is to map the problem so that the answer comes out shifted up by 9 bits (or more) and then to shift the result as necessary. While the embodiment described with reference to Table 1 is intended to handle the requirements of the types of problems identified earlier (sums of products over low to moderate precision data), it is understood that this is a design choice and that alternative embodiments of the invention can handle higher precision data.

TABLE 1

| Signif. | Positive sources [Generation Unit 142-X], [Partial Product Generators 144-X-Y] | Positive Depth | Negative Sources [Generation Unit 142-X], [Partial Product Generators 144-X-Y] | Negative Depth |
|---|---|---|---|---|
| $2^0$ | 0, 0–3 | 4 | | |
| $2^1$ | 0, 4–7 | 4 | | |
| $2^2$ | 1, 0–3 | 4 | | |
| $2^3$ | 1, 4–7 | 4 | | |
| $2^4$ | 2, 0–3 | 4 | | |
| $2^5$ | 2, 4–7 | 4 | | |
| $2^6$ | 3, 0–7 | 8 | | |
| $2^7$ | 4, 0–7 | 8 | | |
| $2^8$ | 5, 0–7 | 8 | | |
| $2^9$ | 6, 0–7 | 8 | 25, 0–1 | 2 |
| $2^{10}$ | 7, 0–7 | 8 | 25, 2–3 | 2 |
| $2^{11}$ | 8, 0–7 | 8 | 25, 4–5 | 2 |
| $2^{12}$ | 9, 0–7 | 8 | 25, 6–7 | 2 |
| $2^{13}$ | 10, 0–7 | 8 | 26, 0–1 | 2 |
| $2^{14}$ | 11, 0–7 | 8 | 26, 2–4 | 3 |
| $2^{15}$ | 12, 0–7 | 8 | 26, 5–7 | 3 |
| $2^{16}$ | 13, 0–7 | 8 | 27, 0–2 | 3 |
| $2^{17}$ | 14, 0–7 | 8 | 27, 3–5 | 3 |
| $2^{18}$ | 15, 0–7 | 8 | 27, 6–7 & 28, 0–1 | 4 |
| $2^{19}$ | 16, 0–7 | 8 | 28, 2–4 | 3 |
| $2^{20}$ | 17, 0–7 | 8 | 28, 5–7 | 3 |
| $2^{21}$ | 18, 0–7 | 8 | 29, 0–2 | 3 |
| $2^{22}$ | 19, 0–7 | 8 | 29, 3–5 | 3 |
| $2^{23}$ | 20, 0–7 | 8 | 29, 6–7 & 30, 0–1 | 4 |
| $2^{24}$ | 21, 0–7 | 8 | 30, 2–4 | 3 |
| $2^{25}$ | 22, 0–7 | 8 | 30, 5–7 | 3 |
| $2^{26}$ | 23, 0–3 | 4 | 31, 0–1 | 2 |
| $2^{27}$ | 23, 4–7 | 4 | 31, 2–3 | 2 |
| $2^{28}$ | 24, 0–3 | 4 | 31, 4–5 | 2 |
| $2^{29}$ | 24, 4–7 | 4 | 31, 6–7 | 2 |

The arrangement of positive and negative sources is intended to cover the requirements of the types of problems identified earlier: sums of products over low to moderate precision data. Negative bits are found starting at $2^9$ because with moderate precision data, the cross product of sign bits By way of example, consider the following problem: $x_0k_0+x_1k_1+x_2k_2+x_3k_3+x_4k_4$, where $x_i$, is a 6 bit unsigned number and $k_i$ is a 12 bit signed number where $k_0=9$, $k_1=-15$, $k_2=40$, $k_3=892$, $k_4=2047$. Table 2 shows the binary form of the coefficients before and after recoding:

TABLE 2

| Coefficient | Binary | Recoded | Pos bits | Neg bits |
|---|---|---|---|---|
| $k_0$ | 0, 0, 0, 0, 0, 0, 0, 0, 1, 0, 0, 1 | 0, 0, 0, 0, 0, 0, 0, 0, 1, 0, 0, 1, | 0, 3 | |
| $k_1$ | −1, 1, 1, 1, 1, 1, 1, 1, 0, 0, 0, 1 | 0, 0, 0, 0, 0, 0, 0, −1, 0, 0, 0, 1, | 0 | 4 |
| $k_2$ | 0, 0, 0, 0, 0, 0, 1, 0, 1, 0, 0, 0 | 0, 0, 0, 0, 0, 0, 1, 0, 1, 0, 0, 0 | 3, 5 | |
| $k_3$ | 0, 0, 1, 1, 0, 1, 1, 1, 1, 1, 0, 0 | 0, 1, 0, 0, −1, 0, 0, 0, 0, −1, 0, 0 | 10 | 2, 7 |
| $k_4$ | 0, 1, 1, 1, 1, 1, 1, 1, 1, 1, 1, 1 | 1, 0, 0, 0, 0, 0, 0, 0, 0, 0, 0, −1 | 11 | 0 |

With reference to Table 2, the bits in the same bit positions for the recoded coefficients are referred to as columns. The columns are referred to starting with zero for the rightmost column and counting up. Thus, there are a total of 2 positive bits in column 0; none in columns 1 and 2; 2 in column 3; none in column 4; and 1 each in columns 5, 10, and 11. Also, there is one negative bit each in columns 0, 2, 4, and 7. To map this problem in the pattern shown in Table 1, the result is shifted up at least 9 positions, since the least significant negative bit available is in column 9. However, to simplify mapping, the result is shifted up by 11 in this example. (again, it is understood that the predefined pattern in Table 1 is a design choice; thus, predefined patterns different from the one in Table 1 are contemplated and these different predefined patterns may provide/necessitate different mapping(s)).

Since the data in this exemplary problem are 6 bit values, each non-zero coefficient position leads to 6 places where a data bit is admitted into the summation circuits. A non-zero coefficient at significance $2^i$ leads to data bits at $2^i, 2^{i+1}, \ldots, 2^{i+5}$. If we number the data bits of $x_i$ $x_{i0}$ through $x_{i5}$, Table 3 shows the summation requirements.

TABLE 3

| Column | Positive | Negative |
|---|---|---|
| 11 | $x_{00}, x_{10}$ | $x_{40}$ |
| 12 | $x_{01}, x_{11}$ | $x_{41}$ |
| 13 | $x_{02}, x_{12},$ | $x_{42}, x_{30}$ |
| 14 | $x_{03}, x_{13}, x_{00}, x_{20}$ | $x_{43}, x_{31}$ |
| 15 | $x_{04}, x_{14}, x_{01}, x_{21}$ | $x_{44}, x_{32}, x_{30}$ |
| 16 | $x_{05}, x_{15}, x_{02}, x_{22}, x_{20}$ | $x_{45}, x_{33}, x_{11}$ |
| 17 | $x_{03}, x_{23}, x_{21}$ | $x_{34}, x_{12}$ |
| 18 | $x_{04}, x_{24}, x_{22}$ | $x_{35}, x_{13}, x_{30}$ |
| 19 | $x_{05}, x_{25}, x_{23}$ | $x_{14}, x_{31}$ |
| 20 | $x_{24}$ | $x_{15}, x_{32}$ |
| 21 | $x_{25}, x_{30}$ | $x_{33}$ |
| 22 | $x_{31}, x_{40}$ | $x_{34}$ |
| 23 | $x_{32}, x_{41}$ | $x_{35}$ |
| 24 | $x_{33}, x_{42}$ | |
| 25 | $x_{34}, x_{43}$ | |
| 26 | $x_{35}, x_{44}$ | |
| 27 | $x_{45}$ | |

In each column, the depth of the positive and negative sources fits within the available depths for that column (as defined in Table 1). Therefore, the problem can be mapped in this way as long as the data bits can be applied to the right ones of the inputs 40.

It should be noted that there will be many possible mappings of multiplicands (data) and corresponding multiplier (e.g., coefficient) bits for any given problem, and that finding any of the possible mappings can be performed by an automated tool.

Figure 1B:
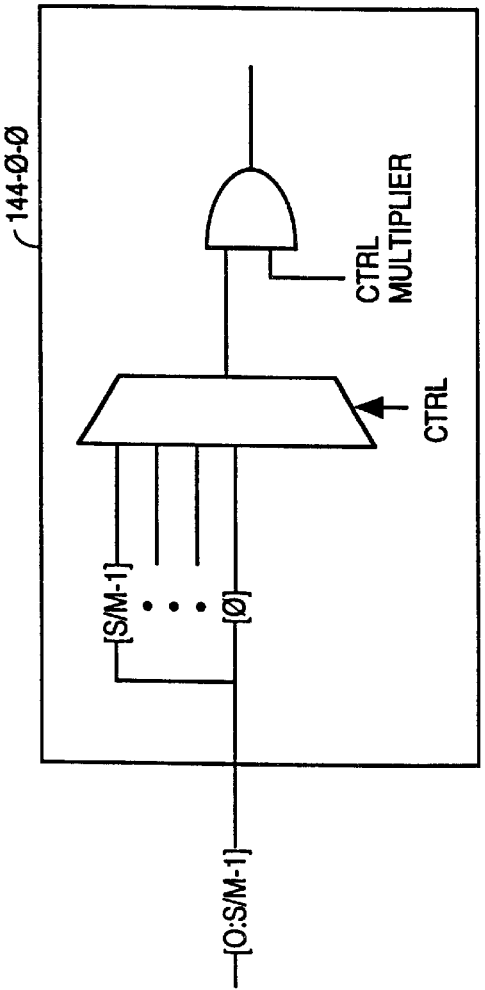
FIG. 1B is a block diagram illustrating a partial product generator from the sums of products datapath of FIG. 1A according to one embodiment of the invention.
Figure 1C:
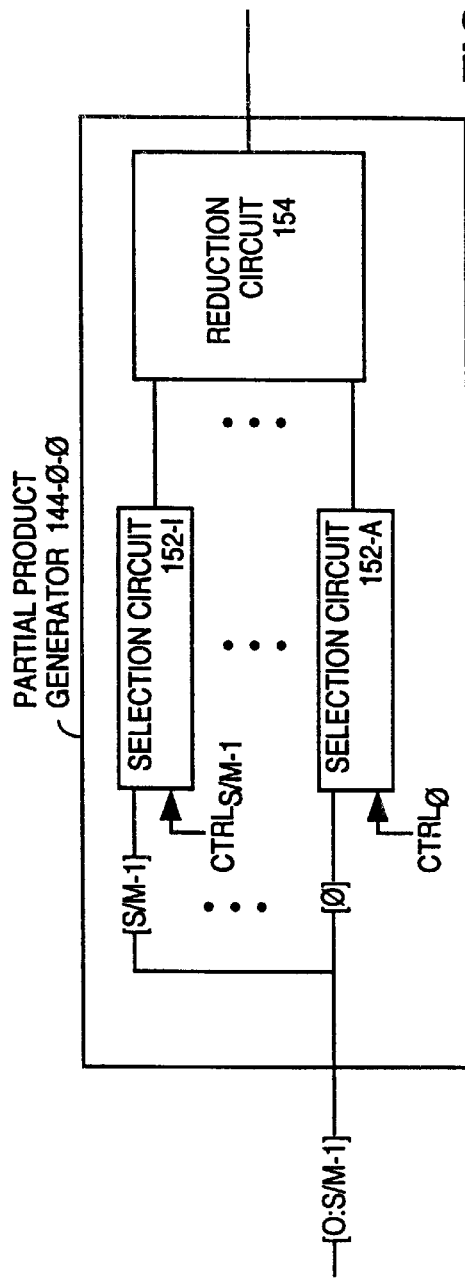
FIG. 1C is a block diagram illustrating a partial product generator from the sums of products datapath of FIG. 1A according to another embodiment of the invention.

FIGS. 1B and 1C are block diagrams illustrating partial product generators for the sums of products datapath of FIG. 1A according to alternative embodiments of the invention. In particular, FIG. 1B illustrates an embodiment of the partial product generator 144-0-0. As previously described, the partial product generator 144-0-0 is coupled to inputs [0:S/M−1] of the inputs 140. Each of these inputs is coupled as the input to a multiplexer. This multiplexer is controlled to select one of the data bits provided on the inputs [0:S/M−1]. The output of this multiplexer is coupled as one of the inputs to an AND gate. The other input to the AND gate is a bit of the selected multiplicand's corresponding multiplier (it should be noted, that if this partial product generator is not needed for the current operation, the input to this AND gate is controlled such that the output of the AND gate will not affect the operation—e.g. the AND gate outputs a zero signal). While particular circuits are shown in FIG. 1B (e.g., an AND gate), alternative embodiments could be implemented using different circuitry that provides a similar output).

In FIG. 1C, an embodiment of the partial product generator 144-0-0 for an alternative embodiment of the invention is illustrated. As in FIG. 1B, the partial product generator 144-0-0 of FIG. 1C is coupled to inputs [0:S/M−1] of the inputs 140. However, in FIG. 1C each of the inputs [0:S/M−1] is coupled to a selection circuit 152-0 through 152-1. Each of the selection circuits 152 also receive an independent control signal that controls whether the data input to that selection circuit is provided at its output. While such operation can be performed by a number of different circuit, in one embodiment of the invention each of the selection circuits is an AND gate.

The outputs of the selection circuits 152 are coupled to a reduction circuit 154 which reduces the data to a single bit. Thus, the selection circuits 152 of the partial product generator 144-0-0 act to inhibit the passing of data bits upon which the partial product generator is not to consider in the generation of its partial product, while the other selection circuit(s) 152 of the partial product generator are controlled by bits of the corresponding multiplier(s). The reduction circuit 154 then combines the outputs of the selection circuits to provide a single bit that is the partial product. While the operation of the reduction circuit 154 can be performed by a number of different circuits, in one embodiment the reduction circuit 154 is an OR gate.

Alternative embodiments of the invention can implement the partial product generators 144 in any number of other ways (e.g., a one hot multiplexer, etc.). Furthermore, while one embodiment is described in which the partial product generators of a given generation unit are all provided to the same summation circuit, in alternative embodiments of the invention: 1) not all of the partial product generators need be coupled to a summation circuit; 2) different partial product generators in a given generation unit can be coupled to different summation circuits; 3) a given partial product generator can be coupled to both summation circuits; etc. Furthermore, while one embodiment is implemented to use the described recoding technique, alternative embodiments of the invention could use a more straightforward approach (e.g., no recoding) and/or a different recoding technique. Such alternative embodiments would have a different configuration of summation circuit(s). In particular, the recoding technique of Table 2 is particularly useful for constant coefficients. Thus, an alternative embodiment designed to operate on more dynamic data may avoid the use of this recoding technique.

The circuit described in FIG. 1A could be used in any number of different systems. By way of example, the circuit of FIG. 1A could be implemented in a field programmable device as described later herein. In addition, it is understood that the circuit of FIG. 1A could be used with different combinations of the items described with reference to the field programmable device herein.

Field Programmable Device

Figure 1D:
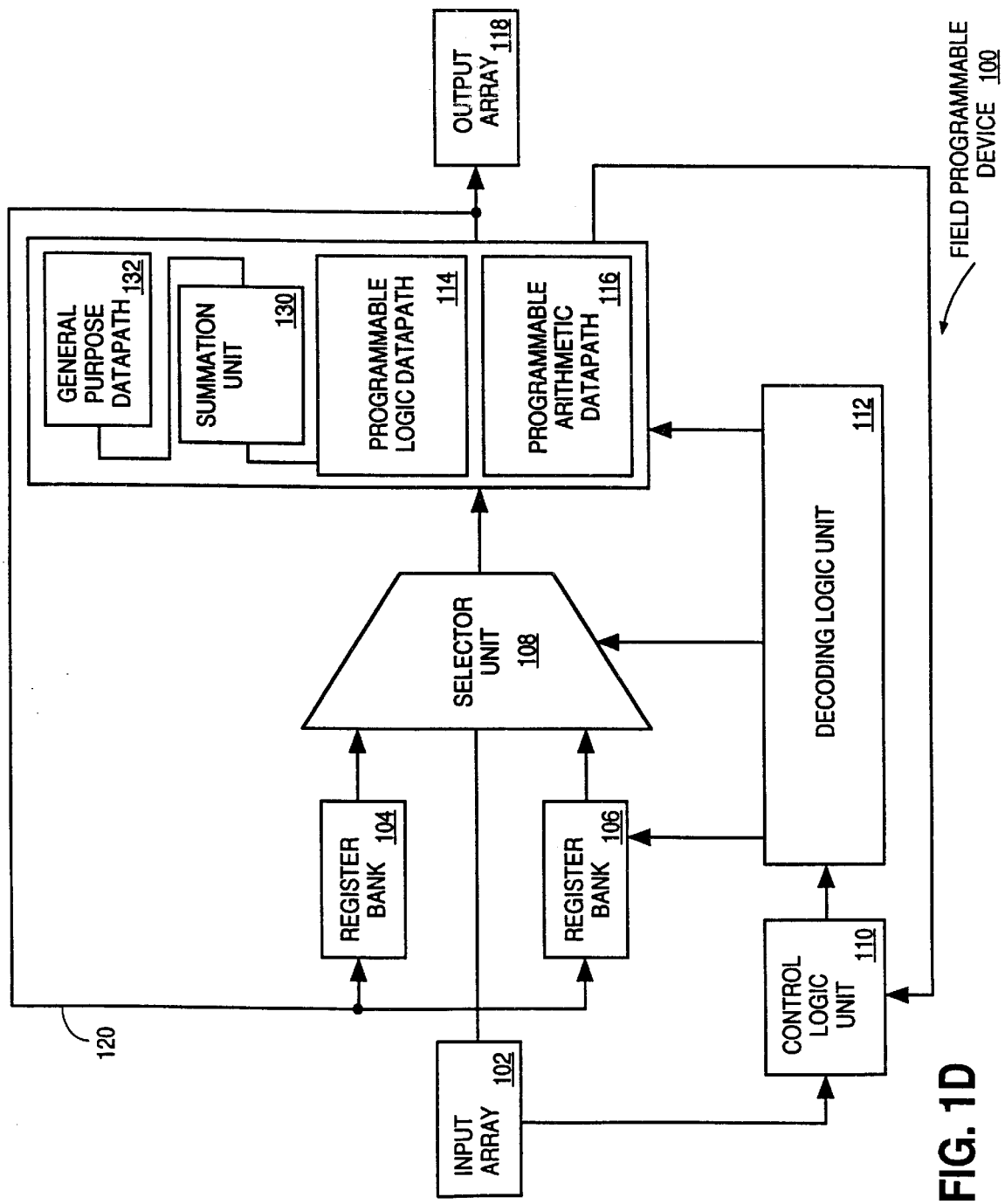
FIG. 1D is a block diagram illustrating a field programmable device according to one embodiment of the invention.

FIG. 1D is a block diagram illustrating a field programmable device according to one embodiment of the invention. In FIG. 1D, a field programmable device 100 is shown which includes an input array 102 and an output array 118. The input array 102 represents one or more bits that are input to the field programmable device 100. Similarly, the output array 118 represents one or more bits that are output by the field programmable device 100. In one embodiment, the input array 102 and/or the output array 118 may represent registered/latched input and output bits, respectively.

The input array 102, a register bank 104, and a register bank 106 are shown coupled to a selector unit 108. The register banks 104 and 106 each represents a set of one or more registers/latches for storing data (or a subset thereof): 1) input into the input array 102; and/or 2) output by the datapath(s) provided via a feedback path 120. Thus, the register bank 104 and/or 106 may represent or include an accumulator, as will become further apparent from the description that follows. In one embodiment, the register banks 104 and 106 are 32-bits wide and 2048 bits deep, and are dual ported for read and write operations. In alternative embodiments, more or fewer register banks may be used having various port and storage capacity configurations. For example, one embodiment has no register banks, but stores inputs and/or results needed for subsequent datapath operations in registers contained in the datapath. Another embodiment does not include any mechanism (e.g., register banks) to store inputs and/or outputs for use in subsequent datapath operations.

The selector unit 108 is shown coupled to provide input from the register bank 104, the register bank 106, and/or the input array 102 to a programmable logic datapath 114, a programmable arithmetic datapath 116, and a general purpose datapath 132. The programmable logic datapath 114, the programmable arithmetic datapath 116, and the general purpose datapath are each coupled to provide output data to the output array 118. The programmable logic datapath 114 and the programmable arithmetic datapath 116 are configured to perform (Boolean) logic operations and arithmetic (e.g., add, multiply, divide, etc.) operations, respectively.

A sums of products datapath is provided by a combination of part of the programmable logic datapath and a summation unit 130. The summation unit 130 is coupled to receive intermediate data results generated by the programmable logic datapath 114. Thus, the summation unit 130 can be conceptualized as a second stage of the programmable logic datapath 114. With reference to the sum of products datapath previously described, circuitry in the programmable logic datapath 114 is used to provide the generation units 142, while the summation unit 130 provides the summation circuits. As described later herein, the sums of products datapath maybe designed to provide one or more sum of products results simultaneously.

The location within the programmable logic datapath 114 that is coupled to the summation unit 130 is a design choice. While various such locations are described herein, it is understood that this design choice is based on the design of the programmable logic datapath and other considerations. As such, various alternative embodiments are contemplated for the coupling of these two datapaths. The output of the summation unit 130 is coupled as an input of the general purpose datapath 132 for purposes described later herein.

The general purpose datapath 132 is configured to perform various general purpose operations (e.g. shifting, packing, relatively simple logic and arithmetic operations). In one particular embodiment, the sums of products datapath can generate two separate sums of products (e.g., two sets of summations circuits are provided) at a time, and the summation unit 130 provides two 32-bit outputs accordingly. The general purpose datapath 132 can shift these two 32-bit outputs by arbitrary amounts and then pack them into a pair of 16-bit numbers.

While one embodiment is described herein in which the sums of products datapath is incorporated as illustrated in FIG. 1D, alternative embodiments can use a number of different approaches. For example, the sums of products datapath could be a separate datapath that receives inputs directly from the selector unit, as opposed to intermediate results from the programmable logic datapath. In such a design, additional logic would need to be included to provide for the generation units of the sums of products datapath. As another example, rather than having a separate summation unit providing separate summation circuits, the summation circuits for the sums of products datapath could be provided by summation circuits in the programmable arithmetic datapath (the intermediate results from the programmable logic datapath 114 would be provided to summation circuits in the programmable arithmetic datapath 116). As yet another example, separate generation units for the sums of products datapath could be included; the results of such generation units being provided to the summation circuits of the programmable arithmetic datapath 116. As another example, the operations described later herein performed by the general purpose datapath 132 for the summation unit 130 could be implemented in dedicated circuitry for the sums of products datapath.

It should be noted that the sums of products datapath described with reference to the field programmable device is designed to operate using corresponding variable multiplicands provided as data through the selector unit and constant coefficients (the multipliers). However, alternative embodiments of the invention could be designed such that both the multiplicands and multipliers are variable data. It should be noted that while the term constant coefficient is used herein, the constant coefficients need not be entirely unprogrammable. For instance, with respect to the field programmable device described herein, control signals representing the constant coefficient multipliers are preprogrammed in a ROM and/or RAM (described later herein) prior to the more dynamic data (the multiplicands) being provided by the selector unit 108. With particular respect to the sums of products datapath, the memory of the decoding logic unit 112 is preprogrammed with data representing the multipliers (e.g. constant coefficients). These control signals are applied to the programmable logic datapath 114 such that part of it acts as the generation units from FIG. 1A as described later herein. In this sense, the multipliers can be changed by selecting different vectors from the memory and/or reprogramming these vectors (if necessary and some form of reprogrammable storage is provided, such as a RAM, and EEPROM, etc.).

It should be noted that one embodiment of the field programmable device is designed so that the sums of products datapath provides good support for constant coefficient sums of products over low precision data, and reasonable support for higher precision data (e.g. up to about 14 bits). One reason for this design choice is that the programmable arithmetic datapath 116 is designed to provide good support for higher precision data (e.g. 16 and 32 bits).

In FIG. 1D, the input array 102 is further coupled to a control logic unit 110, which in turn is coupled to a decoding logic unit 112. In one embodiment, the control logic unit 110 provides an indirect control vector (ICV) to the decoding logic unit 112. While any number of ICVs may be stored in the control logic unit 110, in one embodiment of the invention the control logic unit 110 stores 128 ICVs, each 102 bits in length and consisting of several sub-fields of differing lengths. Some of these sub-fields are used directly to control parts of the field programmable device 100, and are therefore called "direct ICV sub-fields". Other of these sub-fields are further decoded by the decoding logic unit 112, to select other parts of a direct control vector (DCV) to program/configure various portions of the field programmable device 100. These sub-fields are called "indirect ICV sub-fields".

The DCV is selected from as many memories as there are indirect ICV sub-fields. Each memory is of an appropriate width to control those parts of the field programmable device 100 to which it is dedicated, and has a depth, or number of elements, equal to $2^x$ where X is the length of the indirect ICV sub-field that addresses that memory. These DCV memories may be of any type, including one or more of DRAM, SRAM, ROM, etc. While one embodiment is described which uses subfields and separate memories, alternative embodiments could use most or all of the ICV to address a single memory.

In one embodiment, the decoding logic unit stores 32 DCVs for the subset selection portion (described later herein) of the programmable logic datapath 114 in a random access memory (RAM) (alternative embodiments can store more or less DCVs, as well as additionally or alternatively store DCVs in a ROM or other type storage media). The memory width needed to control this portion of the programmable logic datapath in this embodiment is 1536 bits, while the length of the indirect ICV sub-field that addresses this memory is 5 bits (in an alternative embodiment described later herein with respect to FIGS. 9–11, the memory width used to control the subset selection portion is 2048 bits). Other memories control other portions of the selected DCV, applying them as control signals to the selector unit 108, the register bank 106, the register bank 104, other parts of the programmable logic datapath 114, the programmable arithmetic datapath 116, the general purpose datapath 132 and the sums of products datapath.

In one embodiment, the indirect control vectors are selected by the control logic unit 110 from multiple conceptually distinct "threads" of control, using parallel hardware to perform the "thread switching" on a cycle-by-cycle basis. Distinct portions of the register bank 104 and/or the register bank 106 may be used by different threads to avoid thread switching overhead. In an alternative embodiment, the control logic unit 110 is not present and the decoding logic unit 112 is operatively coupled to receive the indirect control vectors from the input array 102 (e.g., an opcode contained in an instruction provided by a microprocessor that may be coupled to the field programmable device 100). In yet another alternative embodiment, rather than decoding, a serially programmable 1-deep memory is included to provide the control signals.

Thus, in one embodiment further described herein, by providing approximately 2,500 control bits concurrently with up to 64 operand bits to selecting, routing and combining circuitry, the programmable logic datapath of the invention can provide dynamic programmability on a cycle-by-cycle basis to perform a number of logic operations on inputs of various lengths and provide up to 64 outputs. In addition, the sums of products datapath can provide dynamic programmability on a cycle-by-cycle basis to perform a number of sums of products operations on multiplicands/multipliers of various lengths. While an embodiment is described with reference to a specific number of inputs, outputs and control bits, alternative embodiments can have more or fewer inputs, outputs and/or control bits.

Programmable Logic Datapath and Sums of Products Datapath

Figure 2:
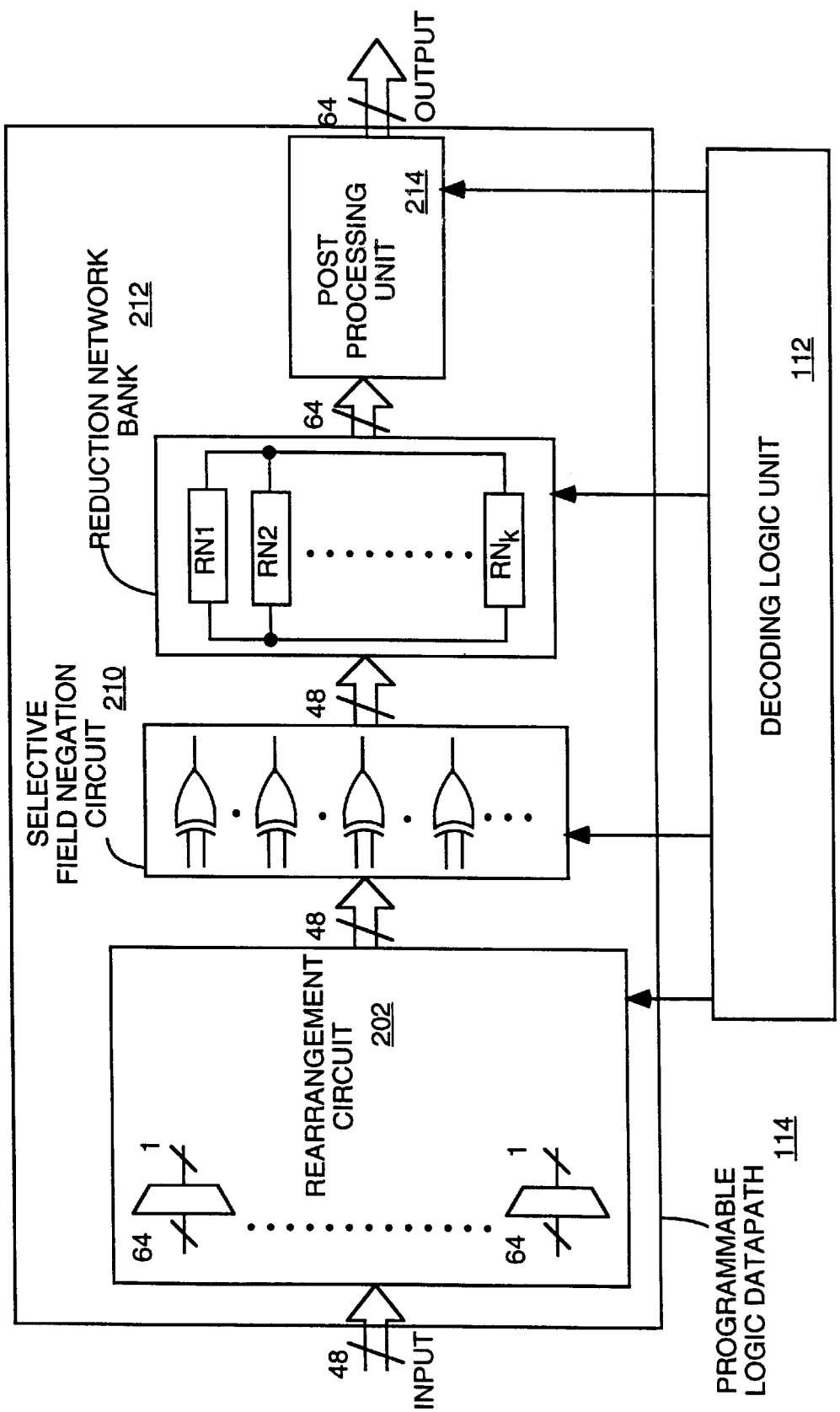
FIG. 2 is a more detailed block diagram of the programmable logic datapath and the sums of products datapath of the field programmable device according to one embodiment of the invention.

FIG. 2 provides a more detailed block diagram of the programmable logic datapath and the sums of products datapath of the field programmable device according to one embodiment of the invention. In FIG. 2, the programmable logic datapath 114 and summation unit 130 of FIG. 1D is shown coupled to the decoding logic unit 112. As described with reference to FIG. 1D, the decoding logic unit 112 provides control bits for the various circuits of the field programmable device 100.

Rearrangement

As shown in FIG. 2, the programmable logic datapath includes a rearrangement circuit 202 configured to allow for flexible rearrangement and duplication of the input data bits. While any number of input bits may be used, the embodiment shown receives 48 input bits, which are either the upper 48 or lower 48 of the 64 bits formed by the concatenation of two 32-bit register bank outputs. The set of input bits may include data bits for a current cycle of operation and/or accumulated bits (e.g., output bits from a previous cycle of a logic and/or arithmetic operation).

The number of bits output by the rearrangement circuit 202 is a design choice. Thus, while one embodiment is described that outputs the same number of bits as are input, alternative embodiments can output more or fewer bits than are input. (If more bits are output than input, by necessity some input bits will be duplicated in the output.)

In one embodiment that receives 48 input bits and provides 48 outputs, the rearrangement circuit 202 comprises a set of forty-eight 48-to-1 multiplexing circuits (each coupled to receive the 48 input bits) for selectively routing any of the 48 input bits to its output. To control the forty-eight multiplexing circuits, each multiplexing circuit receives a different set of six control/configuration bits from the decoding logic unit 112 (making a total of 288 control bits). Thus, the 48 multiplexing circuits operate to dynamically select and/or rearrange (i.e., modify relative bit positions) the input bits.

Figure 3B:
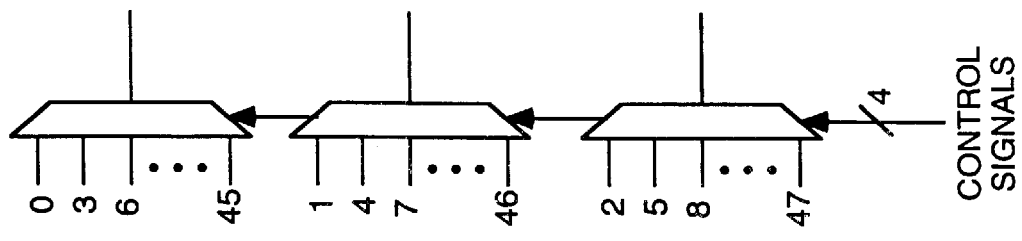
FIG. 3B is a block diagram illustrating one group of three multiplexers that selectively provides one of the three bit fields according to one embodiment of the invention.
Figure 3A:
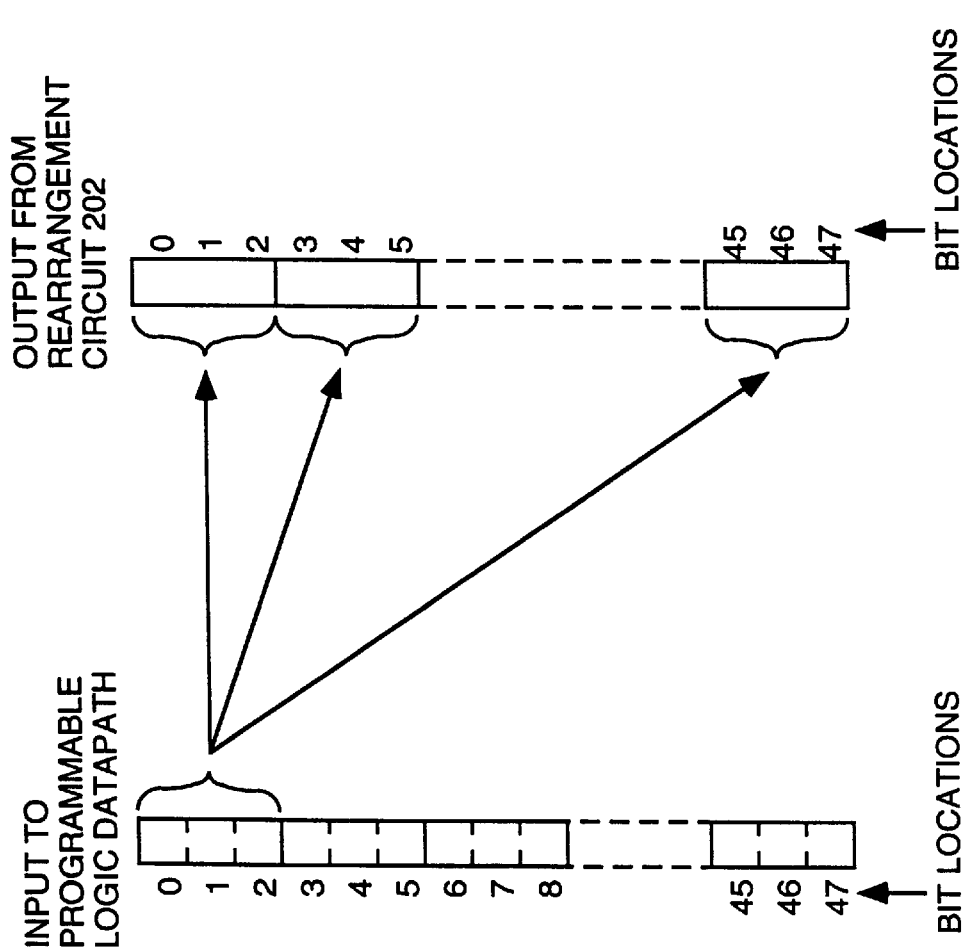
FIG. 3A is a block diagram illustrating the rearrangements of three bit fields according to one embodiment of the invention.

In alternative embodiments, the bits input to the rearrangement circuit 202 may be selectively routed to the outputs in fixed sized, non-overlapping fields of multiple, consecutive bits. For example, one such embodiment selectively routes 48 inputs to 48 outputs using 3-bit fields as shown in FIG. 3A. This embodiment can be implemented using forty-eight 16-to-1 multiplexers, where the forty-eight 16-to-1 multiplexers are grouped in sets of 3 to create 16 groups of 3 multiplexers. FIG. 3B is a block diagram illustrating one group of 3 multiplexers used to route one 3-bit field according to one embodiment of the invention. Each group of multiplexers receives a different set of 4 control bits provided by the decoding logic unit 112 (the multiplexers in each group each receive the same 4 control bits).

In general, given J input bits, L output bits, and a rearrangement field size of F bits (where J/F is an integer), the rearrangement circuit 202 can include L J/F-to-1 multiplexing circuits, each controlled by X control signals, where X is the least power of 2 greater than or equal to J/F, and such that consecutive groups of F multiplexing circuits are controlled by the same X control signals. To illustrate, in the embodiment described above that uses forty-eight 48-to-1 multiplexers, J=48, L=48, F=1, and X=6; while, in the embodiment described above that uses forty-eight 16-to-1 multiplexers, J=48, L=48, F=3, and X=4. While two embodiments of the rearrangement circuit 202 have been described, it should be understood that the rearrangement circuit 202 could be adapted for various input and rearrangement bit field widths.

Selective Field Negation

As shown in the embodiment illustrated in FIG. 2, the rearrangement circuit 202 is followed by a selective field negation circuit 210. The selective field negation circuit 210 selectively negates certain bits output by the rearrangement circuit 202 based on control bits provided by the decoding logic unit 112. In one embodiment, the selective field negation circuit 210 includes one or more logic elements that are configured to selectively negate alternating fields output by the rearrangement circuit 202. The field width used for the selective field negation circuit may be unrelated to that used by the rearrangement circuit. As shown in FIG. 2, the selective field negation circuit 210 includes a series of exclusive-OR (XOR) gates positioned to accept some of the bits output by the rearrangement circuit 202. In one embodiment, the field width for the selective field negation circuit is 3, which means that alternating groups of 3 bits output by the rearrangement circuit 202 are either wired straight through or input to an XOR gate. By supplying a control bit from the decoding logic unit to the other input of each of the XOR gates, the selective field negation circuit 210 provides for the selective negation of every other field output by the rearrangement circuit 202. The number of distinct control bits may be varied according to the degree of general purpose control required. In one embodiment, a different control bit is used for each field of 3 XOR gates, so that the total number of control bits is 8 (since there are sixteen 3-bit fields from 48 bits and half of them are wired straight through).In another embodiment, one bit fields are used wherein every other output of the rearrangement circuit is coupled as an input to an XOR gate, and there are a total of 24 control bits used.

By using a multi-input negation element (e.g., an XOR gate) and by allowing input of an appropriate control input to the negation element, negation of (alternating) rearranged fields may be performed in a controlled/selective manner. As such, subsequent stages of the programmable logic datapath 114 described below can implement logic operations upon mostly positive and/or negative terms, a relatively balanced combination of positive and negative terms, and/or via logical equivalencies as provided by DeMorgan's Law over mostly positive or negative terms.

While one embodiment has been described that selectively rearranges according to predetermined bit fields and selectively negates alternating bit fields, alternative embodiments of the invention may not rearrange input bits and/or not include a selective field negation circuit. Furthermore, in alternative embodiments, input bit field rearrangement and/ or negation may be performed according to several methods other than the ones described above. For example, selective negation may be performed using logic elements other than XOR gates (e.g., inverters and multiplexers).

Reduction Network Bank

Referring again to FIG. 2, the negated and/or non-negated results of the rearrangement circuit 202 (having a total width of 48 bits in one embodiment) are provided to a reduction network bank 212. The reduction network bank 212 comprises a set of (k) reduction networks shown in FIG. 2 as the elements $RN_1$ through $RN_k$. The number of reduction networks is a design choice. In one embodiment, each of 32 reduction networks in the reduction network bank 212 receives the negated and/or non-negated outputs from the rearrangement circuit 202 and generates a two bit result. The structure and operation of a reduction network according to one embodiment of the invention will be described in further detail below with reference to FIGS. 5A–5F.

Sums of Products Datapath

FIG. 2 also illustrates that intermediate results in the reduction network bank 212 are provided to the summation unit 130. A further description of the relationship between the programmable logic datapath 114 and the sums of product datapath is provided later herein.

Post Processing

The reduction network bank 212, upon performing various bit routing, bit selection, and/or logic operations, outputs 64 bits to a post processing unit 214. The post processing unit 214 may be configured to perform various functions upon the output of the reduction network bank 212. For example, in one embodiment, the post processing unit 214 may be configured to detect the number and/or positions of (e.g., zeros and/or ones) in various fields of the output bits of the reduction network bank 212. Several exemplary functions that may be performed by post processing unit 214 and/or the reduction network bank 212 are described below.

In alternative embodiments, the post processing unit 214 may not be included in the programmable logic datapath 114. For example, in one embodiment, a device (e.g., a processor) coupled to the programmable logic datapath of the present invention obtains the output/result generated by the programmable logic datapath and performs a "post processing" function. In another embodiment, post processing functions are not performed. In yet another alternative embodiment, the post processing functions are performed by the general purpose datapath 132. Thus, in this embodiment, the output of the reduction network bank 212 is provided to the general purpose datapath 132.

Reduction Networks in the Reduction Network Bank

Figure 4:
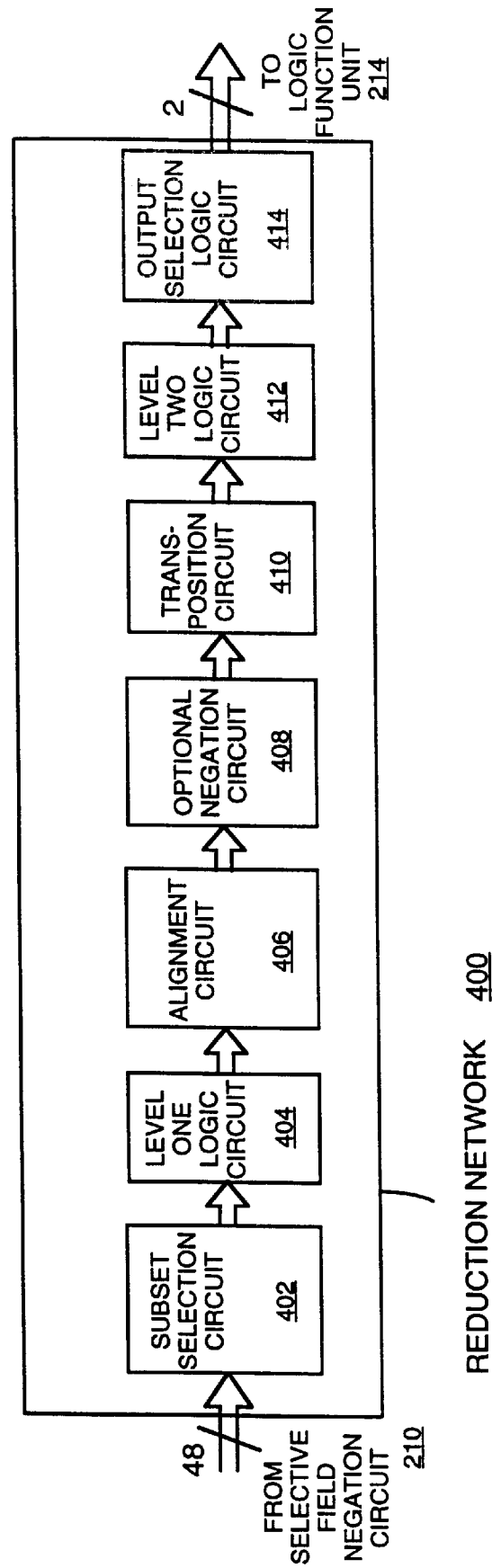
FIG. 4 is a block diagram illustrating a reduction network in the programmable logic datapath according to one embodiment of the invention.

FIG. 4 is a block diagram illustrating one reduction network 400 in the reduction network bank 212 according to one embodiment of the invention. The reduction network 400 includes a subset selection circuit 402. In the embodiment in which the rearrangement circuit provides 48 outputs, the subset selection circuit 402 is configured to receive the 48 outputs from the rearrangement circuit 202 and/or the selective field negation circuit 210. The subset selection circuit 402 provides outputs to a level one logic circuit 404.

In addition, FIG. 4 shows the location within the reduction network 400 chosen for one particular design to be coupled to the summation unit 130. As described later herein, the partial product generators from FIG. 1A are provided by parts of the subset selection circuit 402 and the level one logic circuit 404 in this particular exemplary design.

Subset Selection

Figure 5A:
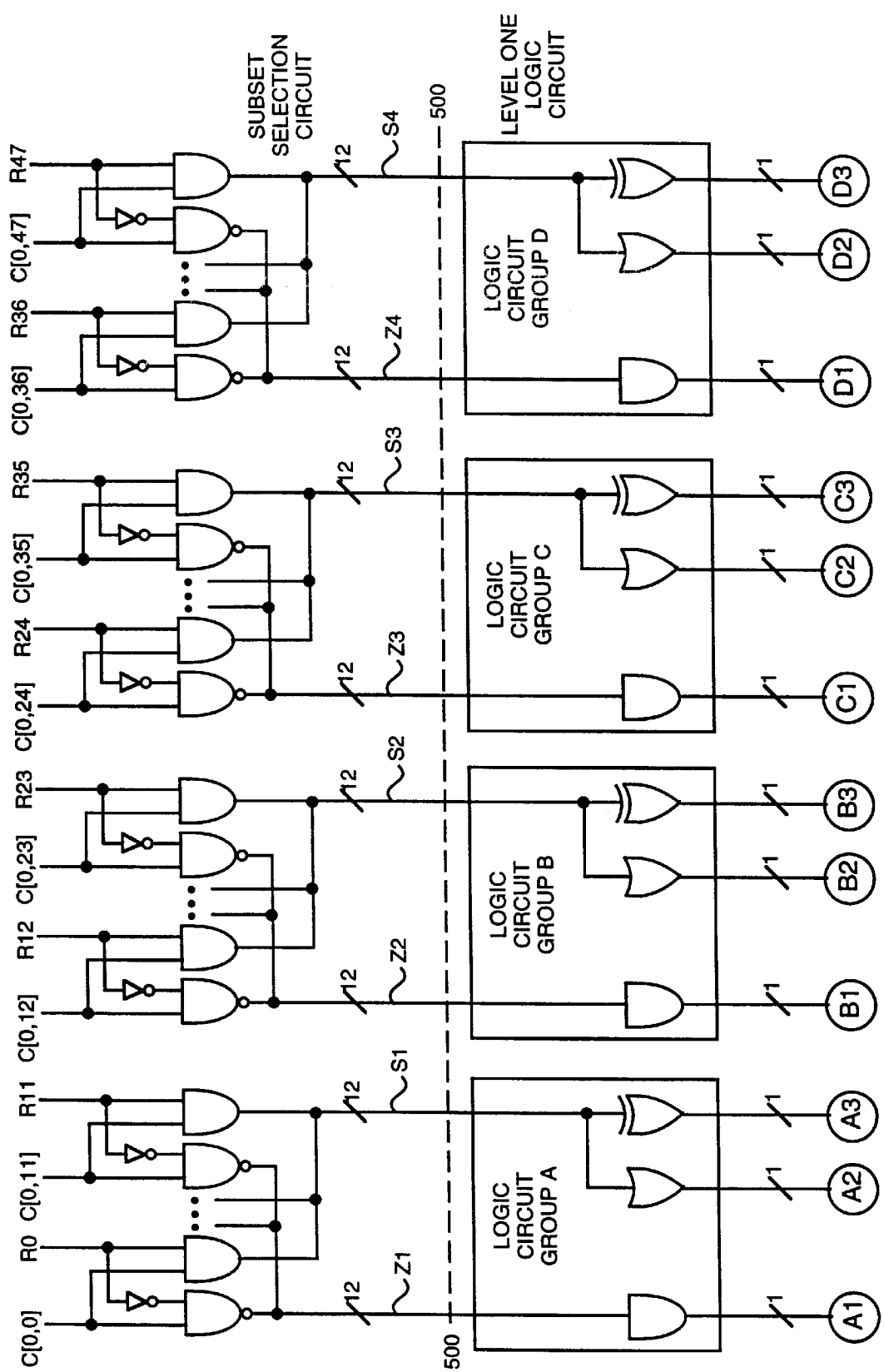
FIG. 5A is a schematic diagram illustrating the subset selection circuit 402 and the level one logic circuit 404 of FIG. 4 according to one embodiment of the invention.

FIG. 5A is a schematic diagram illustrating the subset selection circuit 402 and the level one logic circuit 404 of FIG. 4 according to one embodiment of the invention. In FIG. 5A, the circuitry above and below the dashed line 500 is respectively part of the subset selection circuit 402 and the level one logic circuit 404.

In FIG. 5A, an embodiment of the subset selection circuit 402 that includes four groups of NAND and AND gates is shown, wherein each of the four groups includes twelve pairs of NAND and AND gates. Each AND gate is coupled to receive a control bit $C[i,j]$ and an input bit $R_n$, where i indicates one of the 32 reduction networks 0–31, j represents one of the 48 gate control bits 0–47, and Rn represents one of the bits 0–47 input to the reduction network. Each NAND gate receives the same inputs as the AND gate to which it is paired, except the Rn input to the NAND gate is negated.

By gating the 48 bits with a control bit, a subset of the input bits can be selected (e.g., when the control bit is a logical "1", the input bit will be contained in a subset). The result generated by the 48 NAND gates of the subset selection circuit 402 is shown in FIG. 5A as four twelve-bit output lines Z1–Z4. Similarly, the result of the 48 AND gates is shown as four twelve-bit output lines S1–S4. It should be understood, however, that each of the four lines S1–S4 and Z1–Z4 represents twelve logically/electrically distinct bits.

While one embodiment has been described wherein subset selection is implemented with a series of NAND and AND gate pairs, alternative embodiments may use several other types and/or combinations of logic elements (e.g., NAND gates, NOR gates, MUXes, etc.) to perform subset selection. For example, commonly available logic synthesis tools, such as Design Compiler® from Synopsys®, Inc., might be applied to a design description of the subset selection to create the logically equivalent configuration of gate elements that is optimal for a given VLSI design environment. Furthermore, alternative embodiments of the reduction network 400 may not include a subset selection circuit.

According to one embodiment of the invention, the AND gates of the subset selection circuits are used to provide the selection circuits for the partial product generators 144 of FIGS. 1A and 1C.

Level One Logic

The result generated by the subset selection circuit 402, and in particular, the twelve-bit output lines Z1–Z4 and S1–S4, are shown coupled to four groups of logic circuits A–D, wherein each group includes an AND, OR, and XOR logic network. The four output lines Z1–Z4 are respectively coupled to the AND logic of logic groups A–D, while the four output lines S1–S4 are respectively coupled to both the OR and XOR logic of logic groups A–D. Although each of the four groups of logic circuits A–D is conceptually shown to include three 12-input logic elements, in practice, it should be understood that such elements typically have fan-in limitations that may limit the number of inputs. Accordingly, in one implementation, each group of the logic circuits A–D may contain twelve 2-input AND gates, twelve 2-input OR gates, and twelve 2-input XOR gates. However, it should be understood that several other combinations of input-type (e.g., 2-input, 4-input, 8-input) and/or logic type (e.g., NAND, NOR, NOT, etc.) of logic elements may be utilized in alternative embodiments of the level one logic circuit 404. While one embodiment is shown having three different logic functions in each logic circuit group A–D, alternative embodiment may support more, less, and/or different logic functions.

As shown in FIG. 5A, each of the four logic circuit groups A–D generates three one-bit outputs. For example, the logic circuit group A is shown to generate an AND output bit A1, an OR output bit A2, and an XOR output bit A3. Similarly, the logic circuit groups B, C, and D are shown to generate three output bits B1–B3, C1–C3, and D1–D3, respectively.

While one embodiment is shown in which static logic is used in the logic levels, alternative embodiment replace certain or all of the static logic with logic blocks (e.g., SRAMs).

With respect to the sums of products datapath, in one embodiment of the invention the output of the OR gates in the level one logic circuit provide for the reduction circuits of the partial product generators 144 of FIGS. 1A and 1C. Thus, in an alternative embodiment of the invention, the output of these OR gates are coupled to the summation unit 130 to provide the intermediate results from the reduction networks. In contrast, in the embodiment shown in FIG. 4, one of the outputs from the optional negation circuits 408 for each logic circuit group is coupled to the summation unit to provide the intermediate results from the programmable logic datapath. As such, through the use of the below described alignment elements, any of the logic operations provided by the logic circuit groups (as well as an accumulator input) can be selected for provision to the summation unit.

Alignment

Referring back to FIG. 4, the level one logic circuit 404 is shown further coupled to an alignment circuit 406. The alignment circuit 406, according to one embodiment of the invention, is described with reference to FIGS. 5B and 5C.

Figure 5B:
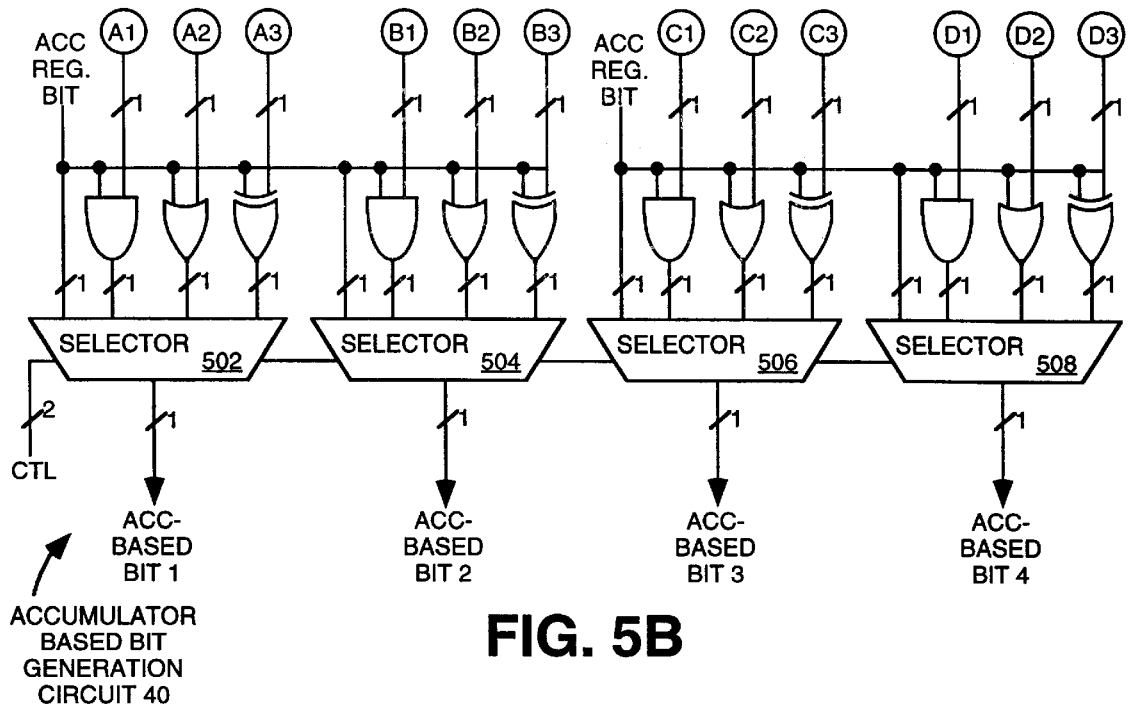
FIG. 5B is a schematic diagram illustrating an accumulator-based bit generation circuit 40 located in the alignment circuit 406 of FIG. 4 according to one embodiment of the invention.
Figure 5C:
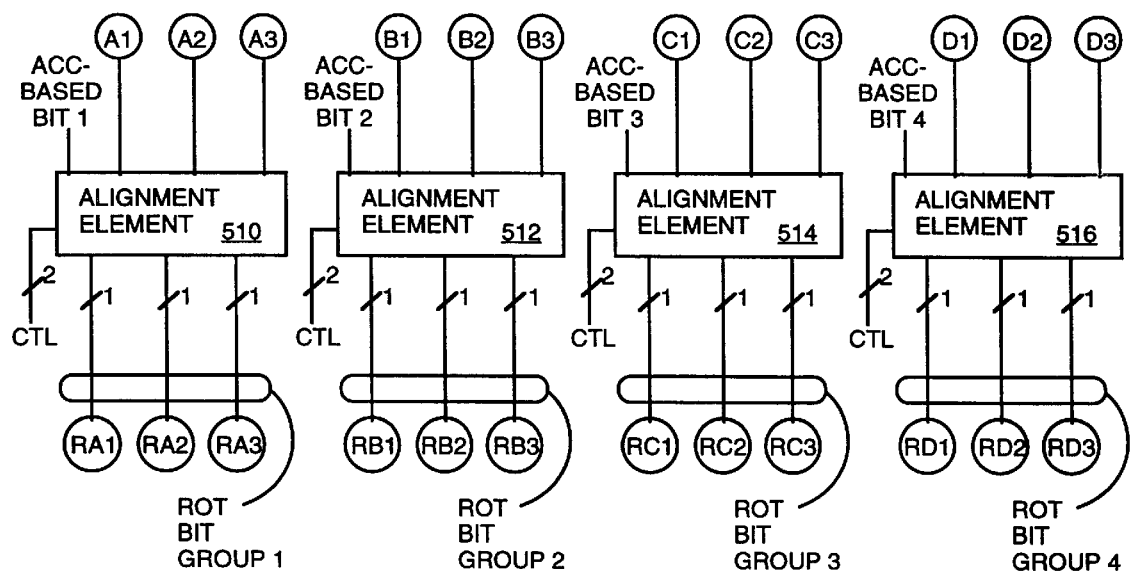
FIG. 5C is a schematic diagram illustrating the remainder of the alignment circuit 406 of FIG. 4 according to one embodiment of the invention.

In one embodiment of the invention, the alignment circuit 406 is configured to receive the output bits A1–D3 of the level one logic circuit 404, as well as a set of accumulator-based bits, as shown in FIG. 5C. FIG. 5B will now be described to illustrate the generation of the accumulator-based bits, according to one embodiment of the invention.

Accumulator

FIG. 5B is a schematic diagram illustrating an accumulator-based bit generation circuit 40 located in the alignment circuit 406 of FIG. 4 according to one embodiment of the invention. As shown in FIG. 5B, the accumulator-based bit generation circuit 40 includes a set of selectors 502, 504, 506, and 508. Each selector is coupled to receive an accumulator register bit, depicted as ACC REG BIT. The ACC REG BITs constitute an additional input to the programmable logic datapath component of the field programmable device, which may represent a stored result of one or more logic and/or arithmetic operations previously performed by the field programmable device 100 of FIG. 1D, or could alternatively be furnished as an additional output of selector unit 108. In one embodiment, there are 64 ACC REG BITs stored within the programmable logic datapath, two for each reduction network 400 of FIG. 4, with one bit associated with selectors 502 and 504 and the other associated with selectors 506 and 508. In addition to the appropriate ACC REG BIT, each selector receives the result of gating the ACC REG BIT with one of the output bits A1–D3 of level one logic circuit 404 (e.g., through an AND, OR, and XOR logic circuit, as depicted in FIG. 5B). In particular, since the output bit A1 was generated by an AND operation, the output bit A1 and the appropriate ACC REG BIT are provided as inputs to an AND gate. In this manner, the result of a previous operation (ACC REG BITs) can be logically combined with the current input.

While one embodiment is shown in which each of the selectors 502, 504, 506, and 508 receives the same two control bits, in an alternative embodiment of the invention each selector receives a different set of control bits. The control bits provided to each selector facilitates selection of one of the inputs of that selector, such as the ACC REG BIT or the gated result of the ACC REG BIT and another bit (e.g., one of the output bits A1–D3 of the level one logic circuit 404 described with reference to FIG. 5A). Accordingly, the selectors 502, 504, 506, and 508 output a selected one of an ACC-BASED BIT 1, ACC-BASED BIT 2, ACC-BASED BIT 3, and ACC-BASED BIT 4, respectively.

It should be appreciated that alternative embodiments may use several types and combinations of logic elements to gate the ACC REG BIT, or may not gate the ACC REG BIT. Furthermore, alternative embodiments of the invention may not include an accumulator-based bit generation circuit and/or utilize an accumulator result.

Alignment Elements

FIG. 5C is a schematic diagram illustrating the remainder of the alignment circuit 406 of FIG. 4 according to one embodiment of the invention. In FIG. 5C, a set of four alignment elements 510, 512, 514, and 516 are shown. Each of the alignment elements 510, 512, 514, and 516 is coupled to receive an ACC-BASED BIT and three output bits of one of the logic circuit groups A–D described with reference to FIG. 5A. For example, the alignment element 510 is shown receiving the ACC-BASED BIT 1, and the bits A1–A3. Similarly, the alignment element 512 is configured to receive the ACC-BASED BIT 2, and the bits B1–B3.

Each of the alignment elements 510, 512, 514, and 516 also receives two control bits. While in one embodiment the alignment elements in each reduction network (e.g., the alignment elements 510, 512, 514, and 516) receive the same two control bits, the level of individual control of the alignment elements is a design choice. In one embodiment, the alignment elements 510, 512, 514, and 516 are each configured to rotate their respective four inputs by either 0, 1, 2, or 3 positions, based on the two control bits, and generate three outputs, RA1–RA3, RB1–RB3, RC1–RC3, and RD1–RD3, which are grouped as ROT BIT GROUP 1, ROT BIT GROUP 2, ROT BIT GROUP 3, and ROT BIT GROUP 4, respectively (ROT is an acronym for "rotated"). The three outputs of each of the alignment elements 510, 512, 514, and 516 represents the rotated/shifted result of three of the four inputs to that alignment element. Thus, in one embodiment, the output bit RA1 of the alignment element 510, for example, may correspond to one of the ACC BASED BIT 1, A1, A2, or A3, depending on the rotation of input bits performed by the alignment element 510.

The alignment elements 510, 512, 514, and 516 are utilized in one embodiment to route/align data bits as they propagate through levels of logic in a reduction network. For example, in the creation of AND-OR logic functions, the level one logic circuit 404 may perform AND operations and the alignment circuit 406 may be utilized to align the result of the AND operations to OR logic elements (e.g., as may be contained in a level two logic circuit, as described below).

However, it should be understood that alternative embodiments of the invention may not include an alignment circuit. It should further be understood that there are several alternative embodiments of the alignment circuit 406 and the alignment elements 510, 512, 514, and 516. For example, shifters, multiplexers, and/or other devices may be utilized to implement the alignment elements 510, 512, 514, and 516. Furthermore, in alternative embodiments, each alignment element may be configured to receive/generate fewer or greater than the number of inputs, control signals, and/or outputs as described with reference to the exemplary embodiment of alignment elements illustrated in FIG. 5C. For example, in one embodiment, one or more alignment elements of the alignment circuit 406 does not receive an ACC-BASED BIT.

Optional Negation

Referring back to FIG. 4, the alignment circuit 406 is further coupled to an optional negation circuit 408. In one embodiment, the optional negation circuit selectively negates one or more of the outputs ROT BIT GROUP 1, ROT BIT GROUP 2, ROT BIT GROUP 3, and ROT BIT GROUP 4 generated by the alignment circuit 406. In one embodiment, the optional negation circuit contains a set of controlled negation elements (e.g., XOR gates) to selectively negate the output bits RA1–RA3, RB1–RB3, RC1–RC3, and RD1–RD3 generated by the alignment circuit 406 based on a control bit. While one embodiment is described in which the output bits of the alignment circuit 406 are selectively negated as a single group, the level of individual control of the negation elements is a design choice (i.e., additional control bits could be used to selective negate different sets of the bits output by the alignment circuit 406).

The optional negation circuit 408 may be utilized in an embodiment of the invention to facilitate certain logic functions, for example, through DeMorgan's law. It should be understood, however, that alternative embodiments of the reduction network 400 may not include the optional negation circuit 408.

Sums of Products Datapath

As previously described, one of the outputs for each logic circuit group from the optional negation circuit 408 is coupled to the summation unit to provide the intermediate results to the summation unit 130. It is again noted that the location within the reduction networks that are coupled to the summation unit is a design choice. With reference to FIGS. 4 and 5A, the groups of data inputs ([R0:R11], [R12:R23], [R24:R35], and [R36:R47]) form the input groups to the partial product generators (with reference to FIG. 1A, the number of inputs S equals 48, the number of partial product generators equals 4, and each of these 4 partial product generators receives 12 bits). To operate the sums of products datapath, the appropriate multiplicand data must be mapped to the appropriate input groups such that the operation can be performed. In embodiments with a selector unit 108 and a rearrangement circuit 202, either one or both of these components can be utilized to achieve the appropriate mappings. For example, the rearrangement circuit can be used to spread out the multiplicand bits, one multiplicand bit per input group. Of course, alternative approaches to achieving the appropriate mapping can be used.

In summary, the rearrangement circuit can be used to route the appropriate multiplicand bits for the desired mapping, while the AND gates of the subset selection circuit and the OR gates of the level one logic circuit can be used to generate the partial products.

As previously indicated, the location within the reduction networks that is coupled to the summation unit 130 could be later in the reduction networks (e.g. following the transposition circuit 410, following the level two logic circuit 412, etc.).

Transposition

Referring again to FIG. 4, the bits output by the optional negation circuit (ROT BIT GROUPS 1–4, one or more of which may be negated) are provided to a transposition circuit 410. In one embodiment, the transposition circuit 410 includes a set of multiplexers configured to accept input, such the ROT BIT GROUPS 1–4, from a set of reduction networks in the reduction network bank 212. The set of multiplexers provide optional transposition (i.e., positional interchange) of rotate bit groups between the set of reduction networks in the reduction network bank 212. In one embodiment, the set of reduction networks whose rotate bit groups may be transposed includes adjacent reduction networks of the reduction network bank 212.

Figure 5D:
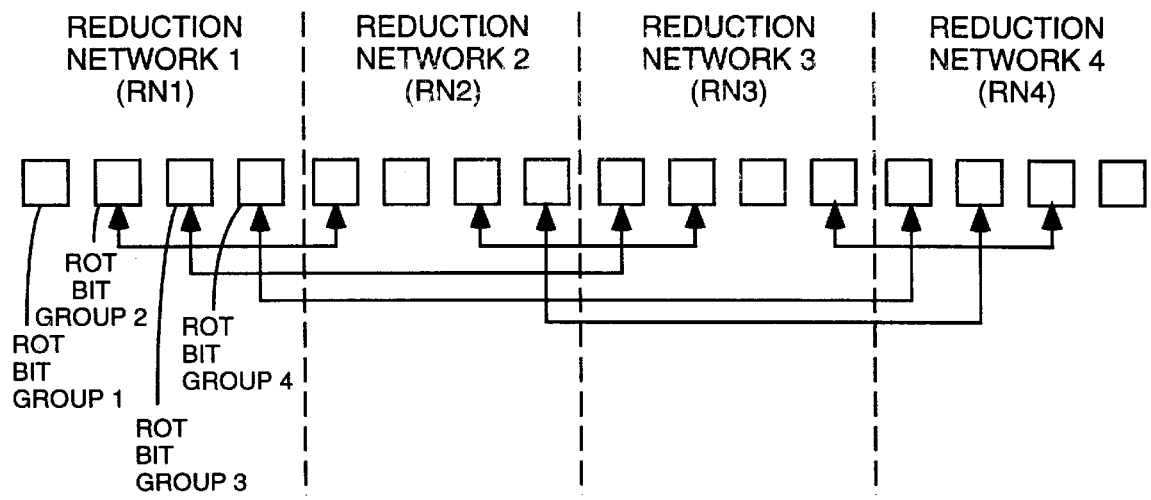
FIG. 5D is a data flow diagram illustrating a 4×4 matrix transposition of operands between four adjacent reduction networks according to one embodiment of the invention.
Figure 5E:
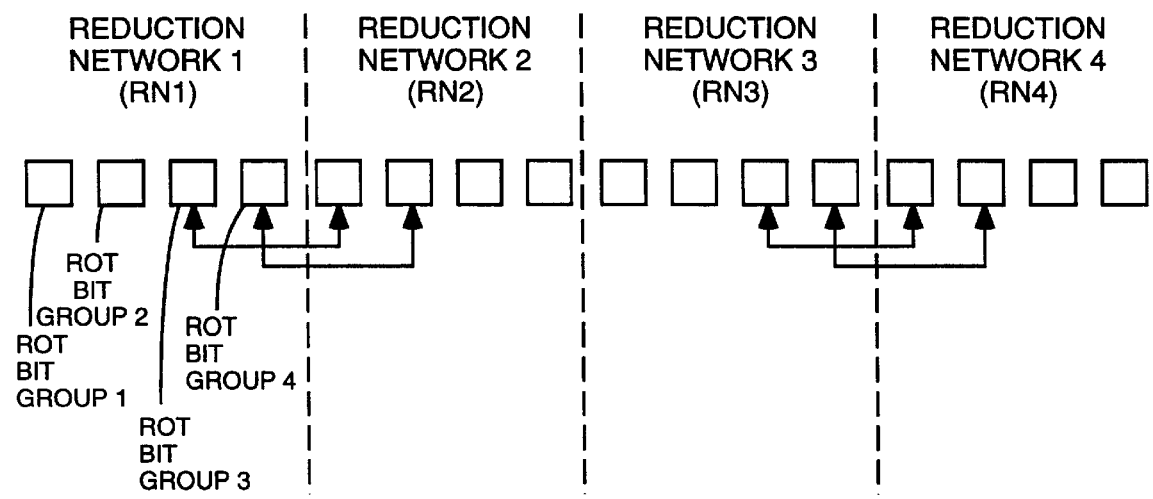
FIG. 5E is a data flow diagram illustrating a 2×2 matrix transposition of operands between four adjacent reduction networks according to one embodiment of the invention.

FIGS. 5D and 5E illustrate two exemplary transposition options that may each or both be implemented by the transposition circuit 410. FIG. 5D is a data flow diagram illustrating a 4×4 matrix transposition of ROT BIT GROUPs between four adjacent reduction networks. In FIG. 5D, the ROT BIT GROUPs 1–4 generated by an alignment circuit, for example, the alignment elements 510, 512, 514, and 516, are depicted by four squares for each of four reduction networks 1, 2, 3, and 4.

As shown by the arrows in FIG. 5D, the ROT BIT GROUPs of one reduction network, such as the reduction network 400, may be transposed (i.e., positionally interchanged) with the ROT BIT GROUPs of another reduction network. For example, as shown in FIG. 5D, the ROT BIT GROUP 2 of a reduction network 1 (RN1) may be transposed with the ROT BIT GROUP 1 of a reduction network 2 (RN2) (which may be adjacent to the reduction network 1 in a reduction network bank). Similarly, as indicated in FIG. 5D, the ROT BIT GROUP 3 of the reduction network 1 (RN1) may be transposed with the ROT BIT GROUP 1 of a reduction network 3 (RN3), while the ROT BIT GROUP 4 of the reduction network 1 (RN1) may be transposed with the ROT BIT GROUP 1 of the reduction network 4 (RN4). Other transposition options are shown by the arrows in FIG. 5D.

FIG. 5E is a data flow diagram illustrating a 2×2 matrix transposition of ROT BIT GROUPs between four adjacent reduction networks. As described with reference to FIG. 5D, the ROT BIT GROUPs 1–4 generated by an alignment circuit, such as the alignment elements 510, 512, 514, and 516, are also depicted in FIG. 5E by four squares for each of four reduction networks 1, 2, 3, and 4. Similarly, arrows are shown in FIG. 5E to indicate the ROT BIT GROUPs interchanged between the reduction networks. For example, as illustrated by one of the arrows in FIG. 5E, the ROT BIT GROUP 3 of the reduction network 1 (RN1) is interchanged with the ROT BIT GROUP 1 of the reduction network 2 (RN2) (Note: In FIG. 5E, reduction networks 1, 2, 3, and 4 are respectively providing rows 1, 3, 2 and 4 of the matrix).

In a typical embodiment, one or more transpositions patterns would be chosen to allow positional interchange of ROT BIT GROUPs among a certain number of reduction networks, and these patterns would be repeated for all the reduction networks in the reduction network bank. For example, in an embodiment comprising 32 reduction networks, both 4×4 and 2×2 transposition patterns might be available for positional interchange among the 8 groups of 4 reduction networks, where the first group consists of {RN1, RN2, RN3, RN4}, the second group consists of {RN5, RN6, RN7, RN8}, and so on.

The number of control bits required depends on the number of transposition patterns chosen. The input width of the multiplexers required to effect transposition depends on both the number of transposition patterns chosen and the position within the group of reduction networks involved. For example, in an embodiment with 4×4 and 2×2 transposition patterns, one can refer to FIGS. 5D and 5E to see how many inputs are needed for each multiplexer. For ROT BIT GROUP 1 of reduction network 1, no multiplexer is needed, as neither transposition pattern interchanges it with another. For ROT BIT GROUP 2 of reduction network 1, a 2-input multiplexer is needed as part of the 4×4 transposition network; it will be steered by a bit that controls whether the 4×4 transposition is in effect or not for this group of 4 reduction networks. For ROT BIT GROUPs 3 and 4 of reduction network 1, two 2-input multiplexers are needed, one for the 4×4 transposition and one for the 2×2 transposition, each steered by a separate control bit. The pattern is not the same for the other reduction networks within the group of 4. For example, in reduction network 2, ROT BIT GROUP 1 requires two 2-input multiplexers, while ROT BIT GROUPs 2, 3, and 4 require a single 2-input multiplexer.

While two exemplary transposition options of the transposition circuit of FIG. 4 have been described, alternative embodiments may facilitate transposition of operands using several other transposition techniques. For example, the set of reduction networks between which transposition may be performed could be fewer or greater than four, as exemplified in the embodiments shown in FIGS. 5D and 5E. Furthermore, transposition schemes other than 2×2 matrix and/or 4×4 matrix may be performed in alternative embodiments. In certain alternative embodiments, ROT BIT GROUPs may be transposed within a reduction network. In other alternative embodiments, the transposition circuit 410 is not included in the reduction network 400.

While one embodiment is described in which optional negation follows rotation and in which transposition follows optional negation, alternative embodiment could rearrange the order of this circuitry. Thus, in an embodiment having alignment and transposition circuitry, the level two logic described below is said to receive data representing the output of the level one logic that has been "routed" to the level two logic via alignment and transposition circuitry, regardless of the order of the alignment and transposition circuitry.

Level Two Logic

Referring again to FIG. 4, the transposed and/or non-transposed ROT BIT GROUPS are provided by the transposition circuit 410 to a level two logic circuit 412, which in turn is coupled to an output selection circuit 414. The level two logic circuit 412 and the output selection circuit 414, according to one embodiment of the invention, are described below with reference to FIG. 5F.

Figure 5F:
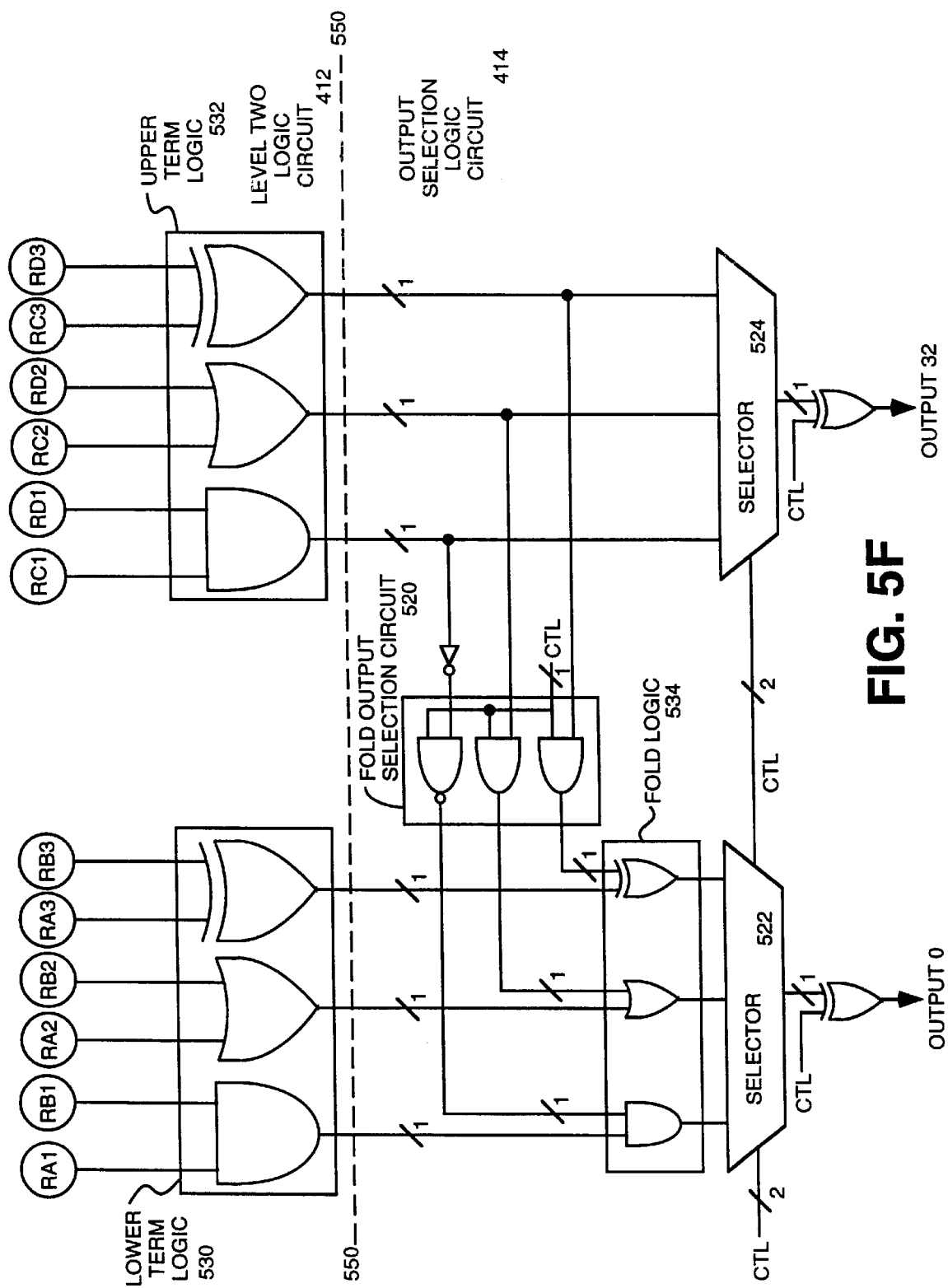
FIG. 5F is a schematic diagram illustrating the level two logic circuit 412 and the output selection circuit 414 of FIG. 4 according to one embodiment of the invention.

FIG. 5F is a schematic diagram illustrating the level two logic circuit 412 and the output selection circuit 414 according to one embodiment of the invention. In FIG. 5F, the level two logic circuit 412 and the output selection circuit 414 are respectively shown above and below the dashed line 550.

In the embodiment depicted in FIG. 5F, the level two logic circuit 412 comprises a set of logic element types similar to ones included in the level one logic circuit 404 described above. As shown, the level two logic circuit 412 includes a lower term logic 530 and an upper term logic 532, each comprising a two-input AND, OR, and XOR gate configured to receive adjacent ROT GROUP BITS. In one embodiment, each ROT GROUP BIT, such as the bit RA1 and/or RB1 shown coupled to the AND gate of the lower term logic 530, may represent a transposed (e.g., from another reduction network) and/or a negated one of the ROT GROUP BITs. On the other hand, one or more of the inputs to one or more of the AND, OR, and/or XOR logic elements of the level two logic circuit 412 may directly correspond (e.g., without transposition and/or negation) to the output of the alignment elements 510, 512, 514, and 516, described with reference to one embodiment of the alignment circuit 406.

While one embodiment is described in which the same logic is in both the level one and two logic circuits, the logic in each level need not be the same and is a design choice. Furthermore, while one embodiment is shown have two levels of logic, alternative embodiments could include additional levels of alignment, negation, transposition, and/or logic.

Output Selection

The three bits output from the upper term logic 532 of the level two logic circuit 412 are fed into a selector 524, as well as a fold output selection circuit 520. The selector 524, based on two control bits, selects one of the results of the upper term logic 532 as an OUTPUT 32. The fold output selection circuit 520 may be included in every reduction network in the reduction network bank 212 to "unfold" the result of the level two logic circuit 412 by one. As such, the fold output selection circuit 520 of the reduction network 400 receives the same control bit as other fold output selection circuits that may be included in other reduction networks. Of course, the granularity of control of the folding circuitry is a design choice.

Thus, each of the reduction networks can be unfolded into two reduction networks (i.e., an upper section according to the upper term and a lower section according to the lower term). In other words, each reduction network can be viewed as being divided into an upper section and a lower section.

As shown in FIG. 5F, the three bit result of the fold output selection circuit 520 are coupled, with corresponding results of the lower term logic 530, to a fold logic 534 which includes an AND, and OR, and an XOR logic element. In this manner, the control bit applied to the fold output selection circuit 520 is used to selectively pass the results of the upper term logic 532 to corresponding gates that combine the corresponding results of the lower and upper term logic 530 and 532.

While one embodiment of the folding circuitry is described, alternative embodiments can use different circuitry. For example, an alternative embodiment provides a set of two 2-to-1 multiplexers, each of which receives one output from the lower term logic 530 and the appropriate logical combination of that output with the corresponding output from the upper term logic 532 (e.g., one 2-to-1 multiplexer receives the output of the AND gate in lower term logic 530 and the logical AND of that output with the output of the AND gate in the upper term logic 532).

The results of the fold logic 534 are coupled to a selector 522, which selects, based on two control bits, one of the results of the fold logic 534 to output as OUTPUT 0. While distinct control bits are used to control the selectors 522 and 524 in the embodiment shown, the level of individual selection of output is a design choice.

In one embodiment, the output of selectors 522 and 524 are respectively coupled to XOR gates which provide conditional negation of the reduction network outputs. These are shown with distinct control bits for each output, however the level of individual selection of conditional negation of outputs is a design choice.

It should be appreciated that alternative embodiments of the invention may not include fold circuitry (e.g., the fold output selection circuit 520, the fold logic 534, etc.), the level two logic circuit 412, and/or the selective negation.

Output

Figure 6:
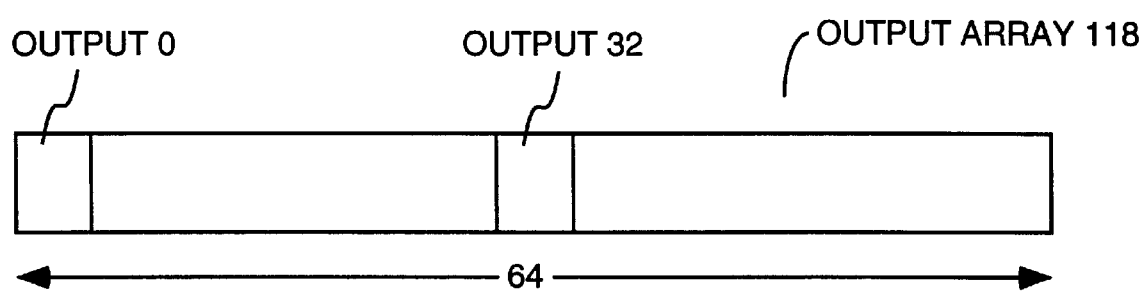
FIG. 6 is a diagram illustrating an output array according to one embodiment of the invention.

Referring now to FIG. 6, a 64 output array 118 according to one embodiment of the invention is shown. The output array 118 illustrates the relative positions of the OUTPUT 0 and OUTPUT 32 result bits generated by the output selection circuit 414 of a first reduction network (e.g. RN1) of the reduction network bank 212. The output array 118 may represent data that is asserted on one or more lines (e.g., on a bus) and/or stored in a storage area, such as a register, accumulator, etc.

Exemplary Logic Operations of an Embodiment of the Reduction Network Bank

In one embodiment, the reduction network bank 212 having 32 reduction networks receiving 48 selectively rearrangeable/negateable inputs bits may be utilized to perform one or more of the following exemplary logic operations:

1. 32 1-level functions of 1 to 48 inputs over Boolean AND, OR, XOR or their negations;
2. 32 2-level functions, with 4 first-level terms of 1 to 12 inputs over Boolean AND, OR, XOR or their negations, and 1 second-level term over Boolean AND, OR, XOR or their negations, with no restrictions as to which functions are used in the first and second level, and with each of the 4 first-level terms being provided by a distinct subset of the 48 outputs (including conditional negation) of the rearrangement circuit 202 when considered as 4 groups of 12 bits;
3. 32 2-level functions, with the same conditions as option 2 except that for functions in positions 0 mod 4, all 4 of the first-level operands may be provided by the first group of the 4 groups of 12 rearrangement circuit (e.g., MUX) outputs, and for functions in positions 1 mod 4, all 4 of the first-level operands may be provided by the second group of the 4 groups of 12 rearrangement circuit outputs, and so on;
4. 32 2-level functions, with the same conditions as option 2 except that for functions in even positions, 2 of the first-level operands may be provided by the first group of the 4 groups of rearrangement circuit outputs and the other 2 of the first-level operands may be provided by the second group of the 4 groups of 12 rearrangement circuit outputs, and for functions in odd positions, 2 of the first-level operands may be provided by the third group of the 4 groups of 12 rearrangement circuit outputs, and the other 2 of the first-level operands may be provided by the fourth group of the 4 groups of 12 rearrangement circuit outputs;
5. 64 1-level functions of 1 to 24 inputs over AND, OR, XOR or their negations;
6. 64 2-level functions, with 2 first-level terms of 1 to 12 inputs over Boolean AND, OR, XOR or their negations, and 1 second-level term over Boolean AND OR, XOR or their negations, with no restrictions as to which functions are used in the first and second level, wherein 32 of the functions may have the 2 first level operands provided by the first and second of the 4 groups of 12 rearrangement circuit outputs, and wherein the other 32 of the functions may have the 2 first-level operands provided by the third and fourth of the 4 groups of 12 rearrangement circuit outputs;
7. 64 2-level functions, with the same conditions as option 6 except that for functions in positions 0 mod 4, both of the first-level operands may be provided by the first group of the 4 groups of 12 rearrangement circuit outputs, and for functions in positions 1 mod 4, both of the first-level operands may be provided by the second group of the 4 groups of 12 rearrangement circuit outputs, and so on; and
8. 64 2-level functions, with the same conditions as option 6 except that for the first 32 functions in even positions, both of the first-level operands may be provided by the first group of the 4 groups of 12 rearrangement circuit outputs, and for the first 32 functions in odd positions, both of the first-level operands may be provided by the second group of the 4 groups of 12 rearrangement circuit outputs; and for the second 32 functions in even positions, both of the first-level operands may be provided by the third group of the 4 groups of 12 rearrangement circuit outputs, and for the second 32 functions in odd positions, both of the first-level operands may be provided by the fourth group of the 4 groups of 12 rearrangement circuit outputs.

Of course, the numbers used above regarding the exemplary logic operations are based on one embodiment and are provided for exemplary purposes. Thus, in alternative embodiments (e.g., see those described herein having different numbers of inputs, different numbers of reduction networks, a different design of reduction network, etc), these numbers may vary and/or the possible operations may differ.

Post Processing

The final stage in the programmable logic datapath 114 is the post processing unit 214, which may be included in one embodiment of the invention to perform post-processing. As such, the post processing unit 214 may include a predetermined set of logic (e.g., Boolean logic) functions that may be computed over the output of the reduction network bank 212. In an alternative embodiment, the post processing unit 214 may implemented as/within a device coupled to a field programmable datapath according to the present invention (e.g., as a co-processing integrated circuit, a CPU, etc.). For example, in an alternative embodiment previously discussed, the post processing functions are performed by the general purpose datapath 132. Thus, in this embodiment, the output of the reduction network bank 212 is provided to the general purpose datapath 132.

In one embodiment, the post processing unit 214 may be configured to perform eight zero detection functions over each of the eight 8-bit fields of the 64-bit output array 118. The zero detection of an 8-bit field can be done with a single 8-input NOR gate; the output of this gate will be 1 just in case all 8 inputs are 0. The eight zero detection functions, accomplished with 8 NOR gates, may be further combined (e.g., using an AND operation) to detect zero across 16-bit fields, 32-bit fields, and/or the entire 64-bit output array 118.

The post processing unit 214 may be further configured, in one embodiment, to encode as a binary number the position of the least significant and/or most significant logical one or zero bit among the 64-bit output array 118. Similarly, the post processing unit 214 may be configured to encode the number of ones and/or zeros in the 64-bit output array 118 and/or a subset thereof.

The post processing unit 214 may be configured to perform a barrel rotate function, which rotates the 64-bit output array, with the rotate amount controlled either by control/configuration bits of a DCV provided by the decoding logic unit 112 and/or from a register that can be set by an output array generated by a previous datapath cycle.

The final result of the programmable logic datapath 114 may be obtained by multiplexing the reducing network bank output(s) with the output(s) of post processing unit 214. As described, the control vectors controlling the programmable logic datapath 114 may be changed dynamically to perform a variety of logic functions.

It should be understood that there are several alternatives to the exemplary embodiment of the field programmable datapath that has been described. For example, alternative embodiment may support various input, output, and control bit widths. Additionally, alternative embodiments of the programmable logic datapath may include various numbers and combinations of logic level circuits, selective negation circuits, transposition circuits, reduction networks, etc. Furthermore, several types and combinations of logic elements (e.g., AND, OR, XOR, NAND, NOR, NOT, etc.) may be utilized in alternative embodiments of the programmable logic datapath of the present invention.

Exemplary Applications of the Programmable Logic Datapath

The present invention may be configured to perform one or more of a variety of applications. Furthermore, the one or more functions may be dynamically (e.g., on a cycle-by-cycle basis) programmed into the programmable logic datapath 114.

As a first example, the programmable logic datapath 114 may configured to perform Content Addressable Memory (CAM) operations. A CAM system element is typically implemented as a specialized circuit element, either on a separate chip or as a block of a larger VLSI chip. CAM is used, for example, in network bridging and routing equipment to provide relatively rapid look up of the address of incoming packets in a table of active addresses. The logical function of a CAM is that of a set of wide AND gates with conditional negation at each input. Each pattern to be matched is "programmed" by negating those inputs corresponding to zeros in the pattern and leaving positive those corresponding to one. The inputs are then combined by a logical AND operation, and the result is a one when the input matches the pattern.

In one embodiment, the programmable logic datapath 114 may be configured to compare up to 32 such patterns in a cycle, each pattern having at least 24 inputs, and possibly more if the patterns have relatively few zeros or relatively few ones. For shorter patterns, the programmable logic datapath 114 may be configured to compare up to 64 patterns in a cycle, while for longer patterns, it may be configured to compare fewer patterns in a cycle.

A second function that may be performed by the programmable logic datapath of the present invention is parity sums. Some problems involve computing parities over subsets of input bits. For example, systems for transmission of ASCII characters may add a "parity bit" which is the XOR sum of the 7 bits in each character, which allows any single transmission error to be detected. More sophisticated systems for error detection and correction are well known. For example, CRC-32 is a relatively widely used algorithm for computing a 32-bit checksum over a set of data that allows many error patterns to be detected. Reed-Solomon codes are even more sophisticated coding schemes that allow errors to be detected and corrected. Both the encoding and the checking step of CRC-32 can be viewed as XOR sums over certain subsets of the input bits together with state bits that are accumulated to form a 32-bit remainder. The same is true for other cyclic redundancy checks, such as CRC-16 and the HEC byte in ATM cell headers. Similarly, Reed-Solomon encoding, as well as many of the steps of Reed-Solomon decoding, may be viewed as computing XOR sums over certain subsets of the input bits together with accumulated state bits. Since the XOR sums of such encoding/decoding schemes are 1-level logic functions, programmable logic datapath 114 can compute up to 32 distinct such functions over 1 to 48 inputs per cycle.

For example, the programmable logic datapath 114 can compute CRC-32 over 16 input bits in a single cycle, while updating a 32-bit state register (e.g., contained in the register bank 104 or 106) for the next 16 bits. Such a technique is an extension of techniques described in T. Pei and C. Zukowski, "High-Speed Parallel CRC Circuits in VLSI", IEEE Trans Comm., V40, no. 4, April 1992, pp 653–657. The programmable logic datapath 114 can also compute other CRCs: 32 input bits at a time of CRC-16, up to 38 input bits at a time of CRC-10, all of the ATM Header Error Check (which is essentially a CRC-8 over 32 data bits). Furthermore, the programmable logic datapath 114 can compute syndromes of Reed-Solomon codes and perform other Reed-Solomon decoding functions over arbitrary Galois Fields of the form $GF(2^n)$.

The preceding examples use 1-level logic functions over many inputs. In hardware design practice, it is very common to use 2-level logic functions as well, with AND-OR logic being the most well established. Complex hardware designs may use more than 2 levels of logic. The programmable logic datapath 114 can perform 2 levels of logic in a single cycle, or more than 2 levels of logic by using multiple cycles. As a third example, the programmable logic datapath 114 can perform a 2-level Boolean logic calculation that is generally considered to be relatively difficult: the "S" functions of the Data Encryption Standard, or DES. The "S" functions, commonly known as "Sboxes" are 8 carefully chosen, random-appearing functions, each mapping 6 inputs to 4 outputs. As such, SBoxes can be considered as 32 single-output Boolean functions of 6 inputs. As reported in J. Robinson and C. Yeh, "A Method for Modulo-2 Minimization", IEEE Trans Comp, v C-31. no 8. August 1982, pp. 800–801, each of the 32 Boolean functions making up the Sboxes requires an average of 27.88 terms in AND-OR logic form. It is shown in the above-referenced paper (Robinson et al.) that using AND-XOR logic with optimal assignment of positive and negative literals to the AND terms results in an average complexity of 12.6 terms. Since the programmable logic datapath 114 can handle 4 terms at a time on 32 outputs, a worst case complexity of 16 terms may be expected, which can be handled in 4 cycles of the programmable logic datapath 114 according to one of the described embodiments.

While several exemplary functions that may be performed by the programmable logic datapath of the present invention have been described, it should be understood that the invention is not limited the functions described.

Exemplary Applications of the Disclosed Programmable Logic Device

Versions of the field programmable device 100 may be used in conjunction with other devices and systems. For example, certain embodiments may include one or more versions of the field programmable device 100 tightly coupled with one or more computer processors (CPUs) and I/O circuitry on a single semiconductor chip (referred to herein as a programmable system chip).

Figure 7A:
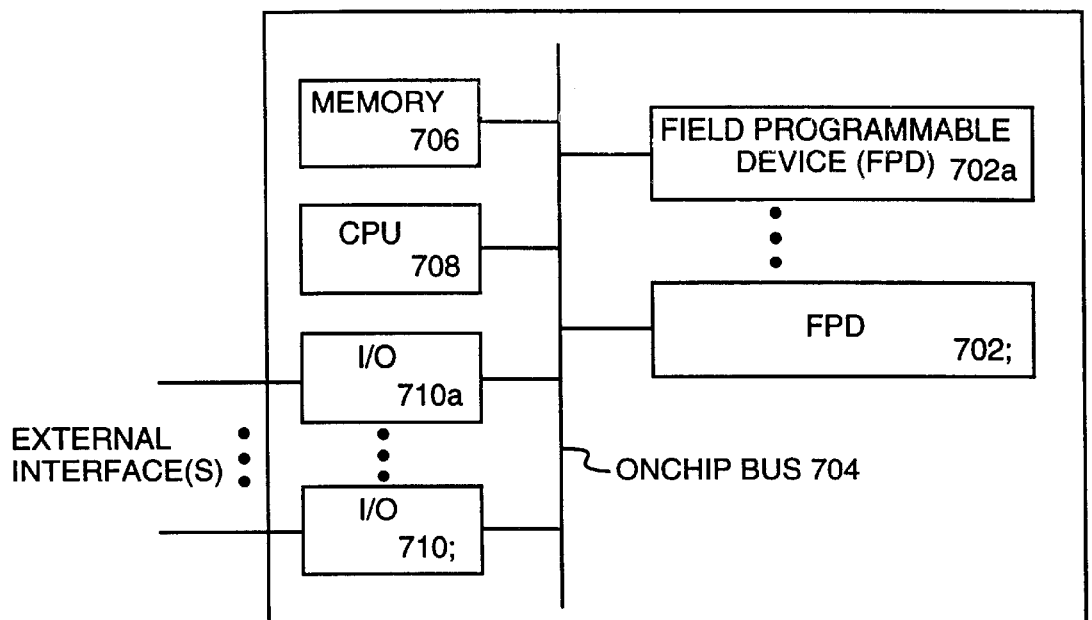
FIG. 7A is a block diagram illustrating an exemplary programmable system chip 700 according to one embodiment of the invention.

FIG. 7A is a block diagram illustrating an exemplary programmable system chip 700 according to one embodiment of the invention. FIG. 7A shows the programmable system chip 700 incorporating one or more field programmable devices 702a–i, a CPU 708, an onchip memory 706 (e.g., SRAM, ROM, RAM, etc.), and one or more blocks of I/O circuitry 710a–j. The onchip elements communicate via an onchip bus 704, which may have any number of data and address wires, but which could conveniently include 32 or 64 data bits and 32 address bits. Such a configuration permits high bandwidth among each of the onchip elements. In an alternative embodiment, one or more of the field programmable devices 702a–i could have dedicated I/O paths, either in addition to or instead of communicating using the onchip bus.

Figure 7B:
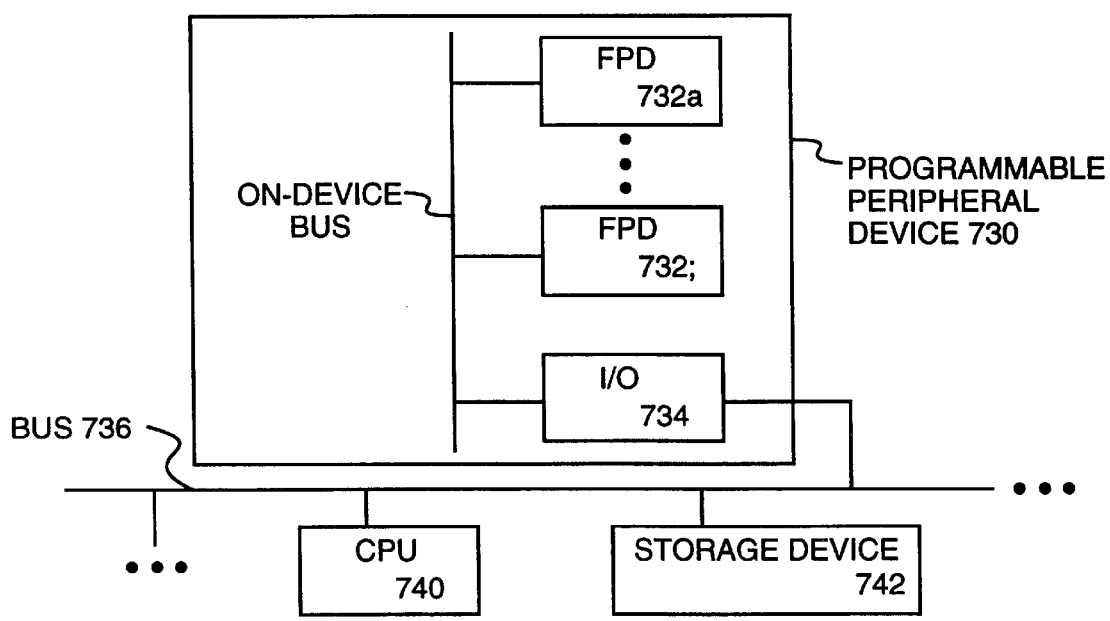
FIG. 7B is a block diagram illustrating an exemplary computer system including a programmable peripheral device 730 according to one embodiment of the invention.

As another example, certain system embodiments may include one or more versions of the field programmable device 100 contained in a "programmable peripheral device" coupled via bus-oriented I/O circuitry to a bus and thereby to a CPU on another chip. FIG. 7B is a block diagram illustrating an exemplary computer system including a programmable peripheral device 730 according to one embodiment of the invention. FIG. 7B shows the programmable peripheral device 730, in which one or more field programmable devices 732a–i are coupled via bus-oriented I/O circuitry 734 to a bus 736 and thereby to a CPU 740 (implemented on one or more other chips). Additionally, a storage device 742 is coupled to the bus 736. The programmable peripheral device 730 may be permanently or non-permanently attached to the bus 736. For example, the programmable peripheral device 730 may be a removable card (e.g., an ISA card, a PCI card, a PCMCIA card, etc.). In addition, the components of the programmable peripheral device 730 may be implemented on multiple chips or on a single chip.

While a single CPU and programmable peripheral device are shown in FIG. 7B, additional CPUs and/or programmable peripheral devices can be added. The storage device 742 represents one or more mechanisms for storing data. For example, the storage device 742 may include read only memory (ROM), random access memory (RAM), magnetic disk storage media, optical storage media, flash memory devices, and/or other machine-readable media. The bus 736 represents one or more busses (e.g., PCI, ISA, X-Bus, EISA, VESA, etc.) and bridges (also termed as bus controllers).

A number of user input/output devices, such as a keyboard, a display and a network, may also be coupled to the bus 736, but are not necessary parts of the invention. As used herein, the term machine readable medium includes the signals (e.g., carrier ways) received via a network.

In the embodiments shown in FIGS. 7A or 7B or their variants, the field programmable devices are configured to operate as co-processing devices under the control of the CPU(s). As such, the field programmable devices perform various functions, based on data inputs and/or control signals received from the one or more CPUs. The CPU(s) configures the field programmable devices (as necessary) by initializing the memories contained in control logic unit (if present) and decoding logic unit (if present). Thereafter, data is transferred across the onchip bus with signals from the input array to the control logic unit and/or decoder to cause the device to read and process the signals on the data and/or address pins of the input array. Similarly, a field programmable device can initiate a data transfer to another field programmable device, the CPU, or other onchip block, by placing data and address values in the output array and raising a signal that initiates the bus transfer.

Versions of the programmable system chip 700 could be advantageously used in applications such as networking, digital video and audio, complex test and measurement tasks, wireless communications, color printing and graphics rendering, hardware simulation, etc. The most desirable types of I/O blocks will vary somewhat depending on the application. For example, in some applications, it would be desirable to have direct interfaces to analog-to-digital and/or digital-to-analog converters. In others, interfaces to a general purpose bus such as PCI are desirable. In still other applications, specific types of interface standards have been developed, such as interface standards for ATM or Fast Ethernet in networking, or interface standards for digital video in multimedia production, for example. To be optimally useful in these application areas, the programmable system chip 700 must support these I/O interfaces.

In all cases, the CPU 708 would be responsible not only for the configuration of the field programmable devices 100, but for all the ongoing control of a complex nature. This includes, for example, the higher layers of network processing, such as receiving and responding to SNMP network management messages. The CPU's ongoing processing may include various kinds of interactions with the field programmable devices. For example, the CPU may request readout of certain registers in the register bank of a certain field programmable device where network statistics have been configured to be stored. As another example, the CPU may determine that a previously unrecognized network address should henceforth be recognized; as a result, it may program the subset selection circuit of a previously unused reduction network bank in the programmable logic datapath to recognize the pattern of bits corresponding to the new network address. As a third example, in a digital video decompression application, a field programmable device might recognize and signal to the CPU the part of a compressed bit stream representing higher level syntactic information to be parsed by the CPU and used to set up control circuitry and register values in the field programmable device.

In all of these examples, the potential for high bandwidth and low latency communication between the CPU and any of the registers within the field programmable devices is a useful feature that is often difficult to provide in prior art designs.

A version of the programmable peripheral device 730 could be advantageously used in reconfigurable computing applications, wherein a CPU 740 sets up the a field programmable chip 730 as a co-processor to perform a specific function and arranges for input data to be provided and output data to be routed appropriately across the bus 736. The advantage of this arrangement is that at a later time a different function could be provided by suitable reconfiguration without changing any of the hardware. The reconfigurable functions might come, for example, from any of the application areas enumerated above.

Other Embodiments of the Field Programmable Device

While several embodiments of the invention have been described, additional embodiments of the invention are described below. These additional embodiments of the invention will be described with reference to the previously described figures. Of course, different aspects of the previously described embodiments and the following can be combined.

Selector Unit

In particular, while the selector unit 108 of FIG. 1D can be implemented in a number of different ways, in one embodiment of the invention the selector unit 108 is composed of multiplexers whose output forms the input to the programmable logic datapath 114 and/or the programmable arithmetic datapath 116. The multiplexers of the selector unit 108 are coupled to select data from different sources, such as the register bank 104, the register bank 106, the input array 102, the output of the programmable logic datapath 114, and the output of the programmable arithmetic datapath 116 (several embodiments of the programmable arithmetic datapath are described in non-provisional application Ser. No. 08/953,766, filed Oct. 17, 1997, entitled "A RECONFIGURABLE ARITHMETIC DATAPATH," to Curtis Abbott; which is a continuation of provisional application No. 60/057,156, filed Aug. 28, 1997; which are hereby incorporated by reference). For example, the selector unit in one alternative embodiment of the invention is coupled to receive data from the register banks and the outputs from the datapaths, but not from the input array (rather, data provided on the input array is stored in the register bank(s) before being processed).

Figure 8:
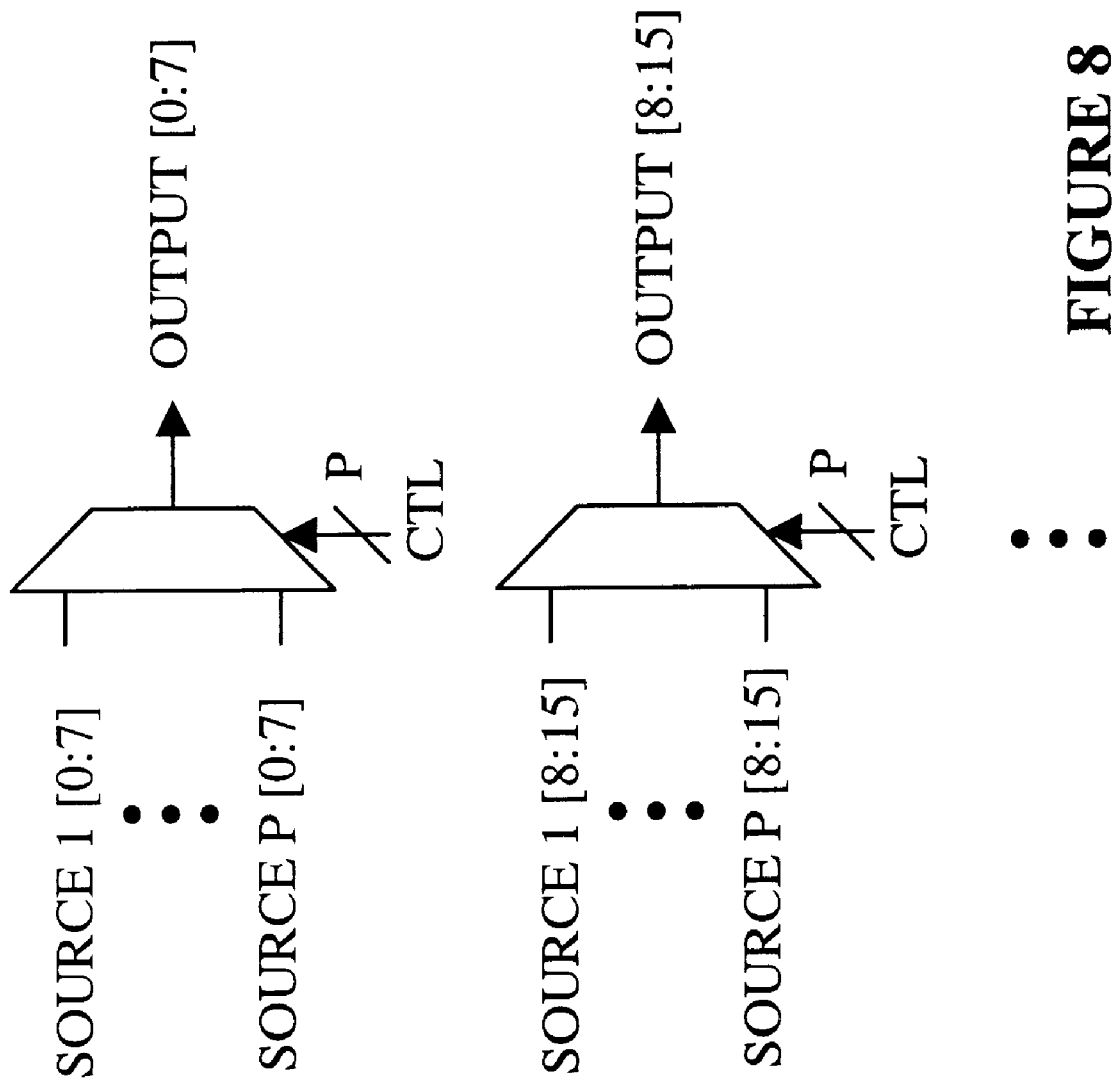
FIG. 8 illustrates the selector unit of FIG. 1D according to one embodiment of the invention.

While different embodiments can implement the selector unit 108 to select data from the sources according to different granularities, in one embodiment of the invention illustrated in FIG. 8 data is selected on a byte-by-byte basis. FIG. 8 illustrates the selector unit of FIG. 1D according to one embodiment of the invention. FIG. 8 shows k byte-wise multiplexers, where k times 8 equals the number of bits output, and where P is the number of different sources. For example, assuming that the selector unit receives 64 bits from 4 different sources and provides 64 bits, the selector unit is composed of 8 byte-wise multiplexers.

In one embodiment of the invention that processes 64 bits, two control fields control the byte-wise multiplexers, an upper field and a lower field. The upper and lower control fields respectively control the upper and lower 32 input bits to the selector unit. Each of the datapaths both provide 64 output bits; the lower and upper 32 of these output bits are respectively fed to the lower and upper input bits of the selector unit. Similarly, the register banks have two ports; port 1 feeds the lower 32 input bits to the selector unit, while port 2 feeds the upper.

Programmable Logic Datapath and Sums of Products Datapath

One alternative embodiment of the programmable logic datapath receives and operates on 64 bits rather than 48 bits as previously described with reference to FIG. 2. Thus, the rearrangement circuit and the selective field negation circuit of this alternative embodiment each receive and output 64 bits instead of 48. In addition, there are 32 reduction networks in the reduction network bank of this alternative embodiment. While the remainder of this section will assume such a 64 bit system, it is understood that the number of bits used is a design choice and that the various implementation alternatives described in previous sections apply equally here.

The programmable logic datapath is a single-operand function unit that performs general-purpose Boolean logic and routing computations. The single-operand nature of the programmable logic datapath is somewhat extended by the previously described byte-wise selector unit.

This alternative embodiment of the invention implements the rearrangement circuit and the selective field negation circuit on a bit-wise basis. In other words, the rearrangement arrangement circuit provides a bit-wise crossbar switch composed of sixty-four 64-to-1 multiplexers that allow for arbitrary permutation and copying of the input bits. As such, the multiplicands to be operated on by the sums of products datapath can be mapped as necessary by the rearrangement circuit. This independent control requires: 1) for the rearrangement circuit, six bits per multiplexer times 64 multiplexers for a total of 384 control bits per instruction; and 2) for the selective negation circuit, 64 control bits.

Taken together, the bit-wise rearrangement circuit and selective field negation circuit allow for placement of positive or negative literals from any input bit position at any result bit position. These 64 positive/negative literals are input to the reduction network bank of the programmable logic datapath, and therefore are referred to as reduction network inputs.

Reduction Network Bank

Figure 9:
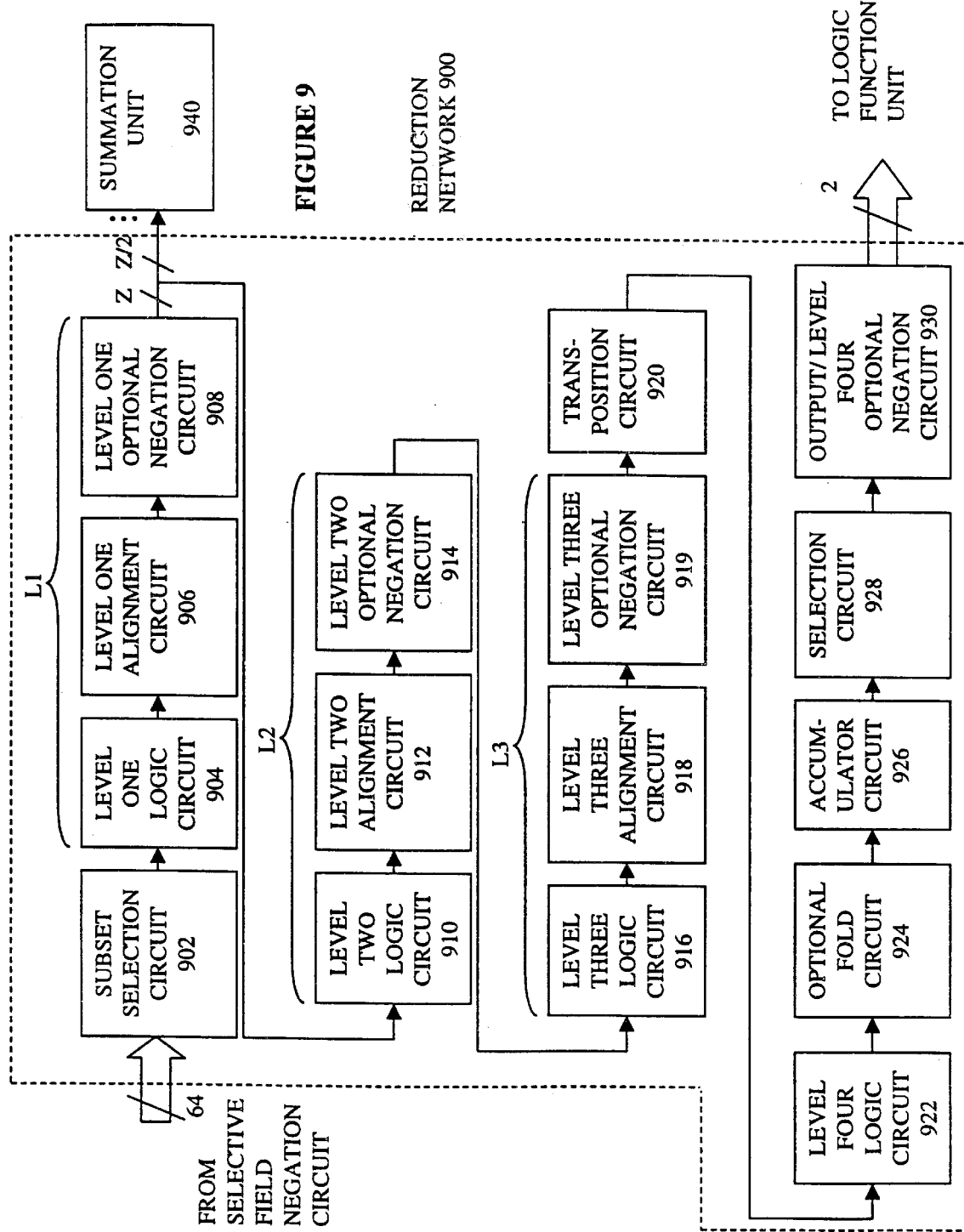
FIG. 9 is a block diagram illustrating one reduction network 900 in the reduction network bank according to an alternative embodiment of the invention.

FIG. 9 is a block diagram illustrating one reduction network 900 in the reduction network bank according to an alternative embodiment of the invention. In contrast to the reduction network of FIG. 4, the reduction network of FIG. 9 has four logic levels.

FIG. 9 shows a subset selection circuit 902, three logic levels (L1–L3), a transposition circuit 920, a level four logic circuit 922, an optional fold circuit 924, an accumulator circuit 926, and an output/level four optional negation circuit 930. Each of the first three logic levels (L1–L3) is made up of generally the same circuits: a logic circuit, an alignment circuit, and an optional negation circuit (further described below). In the embodiment of FIG. 9, the fourth logic level is intermixed with the output selection logic circuit. In particular, the fourth logic level is comprised of the level four logic circuit 922 and the output/level four optional negation circuit 930. Thus, the fourth logic level is similar to L1–3, except that it does not include an alignment circuit. The output selection logic circuit is comprised of the optional fold circuit 924, the selection circuit 928, and the output/level four optional negation circuit 930.

FIG. 9 also illustrates the coupling of the reduction network to a summation unit 940 to provide a sums of products datapath. In particular, FIG. 9 shows that certain outputs of the level one optional negation circuit 908 are coupled to the summation unit for the sums of products datapath. As before, the location within the reduction networks selected for coupling to the summation unit is a design choice. For example, the summation unit could be coupled between any of the circuits shown in FIG. 9 (e.g. between the level one logic circuit 904 and the level one alignment circuit 906, between the level one alignment circuit 906 and the level one optional negation circuit 908, between the level two logic circuit 910 and the level two alignment circuit 912, etc.). The particular outputs of the level one optional negation circuit 908 that are coupled to the summation unit in one embodiment of the invention are described later herein with respect to FIG. 11.

Figure 10:
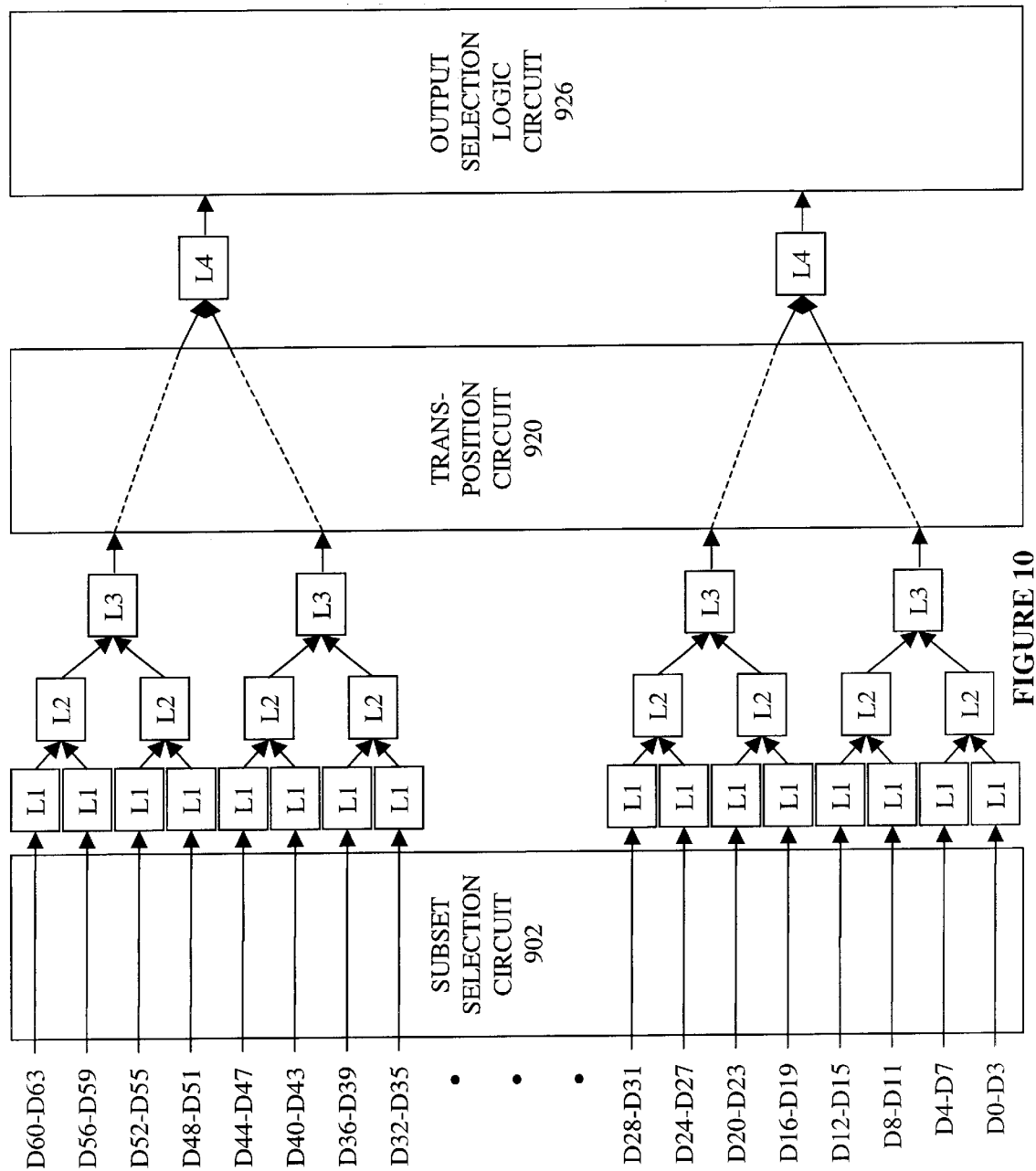
FIG. 10 is a block diagram illustrating a different representation of the reduction network of FIG. 9 according to one embodiment of the invention.

FIG. 10 is a block diagram illustrating a different representation of the reduction network of FIG. 9 according to one embodiment of the invention. FIG. 10 illustrates that the L1 logic level performs a four-to-one reduction, whereas the L1–L4 logic levels each perform two-to-one reductions. Alternative implementations can include more or less logic levels, as well as provide for different amounts of reduction at any given level.

Figure 11:
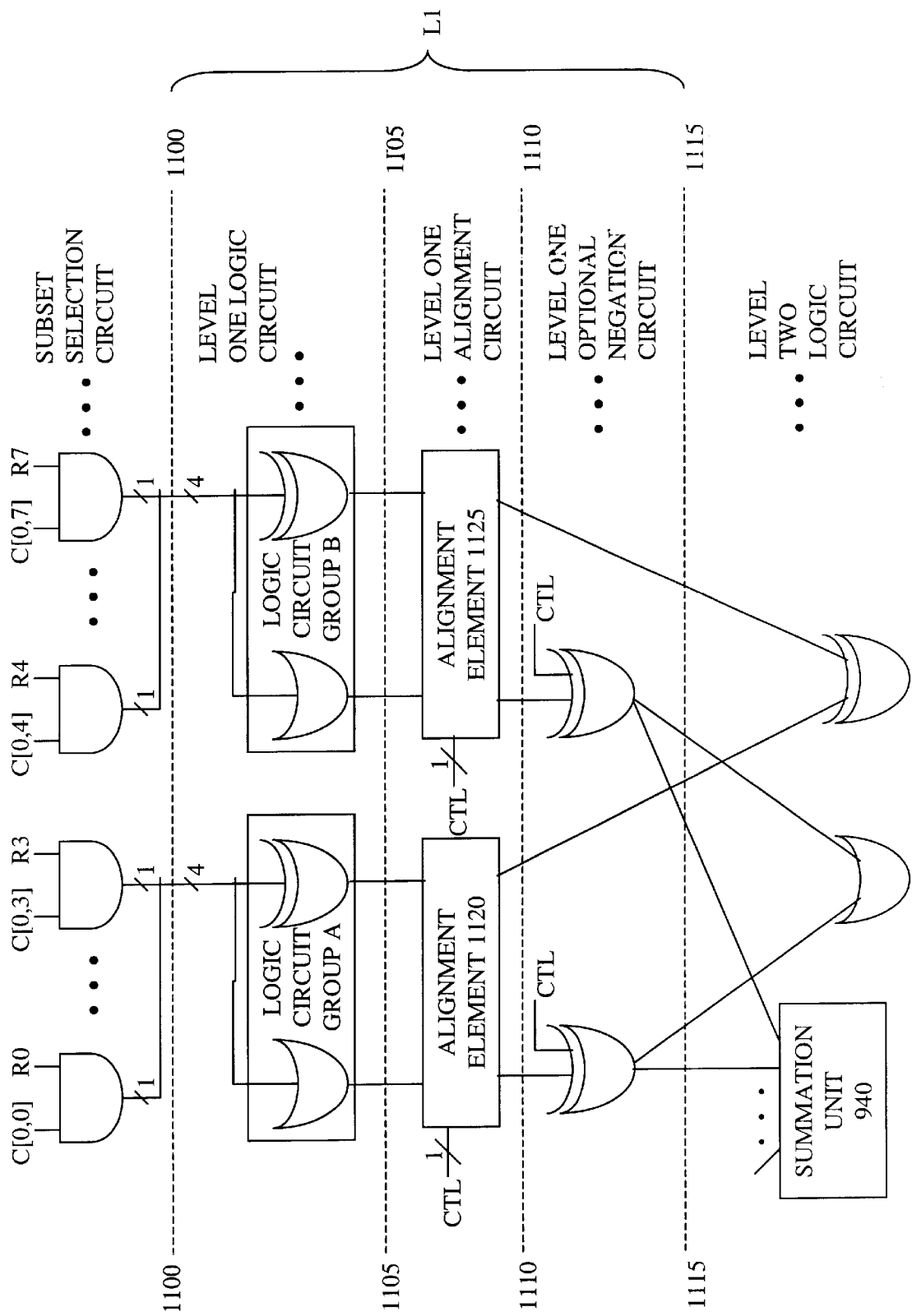
FIG. 11 is a schematic diagram illustrating parts of the subset selection circuit 902, the L1 logic level, and the level two logic circuit 910 of FIG. 9 according to one embodiment of the invention.

FIG. 11 is a schematic diagram illustrating parts of the subset selection circuit 902, the L1 logic level, and the level two logic circuit 910 of FIG. 9 according to one embodiment of the invention. Table 4 below identifies the circuitry with respect to the dashed lines in FIG. 11.

TABLE 4

| Dashed Lines | Circuitry From |
|---|---|
| Above 1100 | Subset Selection Circuit 902 |
| Between 1100 and 1105 | Level One Logic Circuit 904 |
| Between 1105 and 1110 | Level One Alignment Circuit 966 |
| Between 1110 and 1115 | Level One Optional Negation Circuit 908 |
| Below 1115 | Level Two Logic Circuit 910 |

The exemplary implementation of the level one logic circuit 804 shown in FIG. 11 operates on groups of four bits using OR and XOR gates, as opposed to the exemplary implementation of the level one logic circuit 404 shown in FIG. 5A which operates on groups of twelve bits using AND, OR and XOR gates. As a result, the subset selection circuit of the embodiment of FIG. 11 includes sixteen groups of AND gates, wherein each of the sixteen groups includes four AND gates. Each AND gate in the subset selection circuit in FIG. 11 is coupled to receive a control bit C[i,j] and an input bit Rn, where i indicates one of the 64 reduction networks 0–63, j represents one of the 64 gate control bits 0–63, and Rn represents one of the bits 0–63 input to the reduction network.

The result of each group of AND gates from the subset selection circuit is provided to a different logic circuit group of the level one logic circuit 904. For example, FIG. 1 .shows that the outputs of the first two groups of four AND gates are respectively provided to logic circuit groups A and B. Each of the logic circuit groups separately ORs and XORs its inputs; and accordingly provides a pair of output bits.

Each pair of output bits is provided to an alignment element of the level one alignment circuit 906. For example, in FIG. 11 the output bits from the logic circuit groups A and B are respectively provided to an alignment element 1120 and 1125. In contrast to the alignment elements of FIG. 5C that receive four data inputs, the alignment elements of FIG. 11 receive two data inputs. Since the alignment elements 1120 and 1125 are operating on only two inputs bits, they can each be implemented to optionally switch with one bit control; as opposed to the rotation logic of the alignment elements in FIG. 5C that each require 2 control bits. The term "OR output" refers to the output that provides the result of the OR operation in the level one logic circuit when no switch is performed by an alignment element.

As illustrated in FIG. 11, the OR output from each of the alignment elements is provided to optional negation circuitry, whereas the other output (the "XOR output") is passed through to the level two logic circuit. The combination of the OR/XOR logic and the optional negation of the OR output of the alignment elements allows the combination of AND, OR, and XOR logic to be achieved through DeMorgan's Law. Of course, supporting AND, OR, and XOR operations through actual gates or DeMorgan's Law, as well as the number of operation types performed, is a design choice.

With respect to the sums of products datapath, the AND gates of the subset selection circuit again act as the selection circuits 152 from FIGS. 1A and 1C. Since there are 64 inputs to the reduction network (S from FIG. 1A equals 64) and these 64 inputs are divided into groups of 4 inputs ([R0:R3], [R4:R7]..., [R60:R63]), the reduction network provides for 8 partial product generators (M in FIG. 1A equals 8). In addition, the OR gates of the level one logic circuit 904 operate to provide the reduction circuits 154 of FIGS. 1A and 1C. The outputs of the level one optional negation circuit in FIG. 11 are shown as being coupled to the summation unit 940 of the sums of products datapath.

In the embodiment shown in FIGS. 10 and 11, the adjacent alignment elements in the level one alignment circuit 906 are paired. The outputs (after passing through the level one optional negation circuit 908) from each pair of adjacent alignment elements is combined in a logic circuit group of the level two logic circuit 910.

The L2 and L3 logic levels follows generally the same structure as the L1 logic level. The output from the L3 logic level is provided to the transposition circuit 920.

As used herein, a literal is a positive or negative instance of a (single bit) variable, while a term is a combination of literals by one of the standard Boolean functions (e.g., AND, OR, XOR). In operation, the selective field negation circuit (e.g., see FIG. 2) outside the reduction network bank allows positive and negative literals to be created. In contrast, the optional negation circuits of L1–L3 allow application of DeMorgan's Law, so that any AND or OR term can be created.

For example, suppose it is desired to generate the term $d_0 \sim d_2 \sim d_5 d_6$, wherein ~denotes negation, concatenation denotes AND, and d is an input to the rearrangement circuit. By DeMorgan's Law, this is equivalent to $\sim(\sim d_0 + \sim d_2 + d_5 + \sim d_6)$, wherein+ denotes OR. This result can be achieved by:

1) Ensuring that $d_0$ and $d_6$ are negated in the selective field negation circuit
2) Ensuring that $d_2$ and $d_5$ are left positive
3) Setting the first eight AND gates in the subset selection circuit to 10100110 (counting left to right with bit 0 on the left)
4) Setting the level one alignment and negation circuits to neither switch nor negate
5) Setting the level two alignment and negation circuits to negate but not switch At this point, the desired output is available at the OR output of the level two alignment element in the level two alignment circuit. By setting and subsetting the AND gates as described above, the desired literals are applied to the term being computed. By setting the level one alignment and negation circuits to pass the inputs unchanged, the four-input OR gates from both logic circuit groups A and B (see FIG. 11) are turned into an eight-input OR gate (and similarly for the XOR gates). By setting the level two alignment and negation circuits as described above, we apply DeMorgan's Law.

To continue this example, suppose it is desired to compute the sum of the term above ($d_0$~$d_2$~$d_5d_6$) and ~$d_9d_{12}d_{13}$~$d_{14}d_{15}$. Using reasoning similar to the above example, the second term can be computed as ~($d_9$+~$d_{12}$+~$d_{13}$+$d_{14}$+~$d_{15}$). As such, the OR gate of the L3 logic level combines the terms to create the desired function (the level three optional negation circuit will not be set to negate).

Next, assume that the desired function is ($d_0d_2$~$d_5d_6$) $\oplus$ ~$d_9d_{12}d_{13}$~$d_{14}d_{15}$ (i.e., the same terms, but combined by an XOR operation). To achieve this, the two alignment/optional negation elements that compute the AND terms must be set to switch, so the input coming from the OR gate goes out to the XOR gate at the next logic level, and vice versa (note that the OR-XOR signal is the one of interest, but the reduction networks also computes the XOR of the terms combined by the OR operation—i.e., the function $d_0 \oplus d_2 \oplus d_5 d_6$+~$d_9 \oplus d_{12} \oplus d_{13} \oplus d_{14} \oplus d_{15}$ where some of the negations have been removed because this is logically equivalent under XOR).

Recall that in the illustrated embodiment there is no optional negation on the XOR output of an alignment element. Therefore it is irrelevant in this case how the negation controls of the optional negation circuit are set. These negation controls are missing because there is no loss of expression in leaving them out. In the example at hand, it was desired to compute ~(~$d_0$+~$d_2$+$d_5$+~$d_6$) and ~($d_9$+~$d_{12}$+~$d_{13}$+$d_{14}$+~$d_{15}$) at the term level. Since these are now being combined with an XOR operation, negating two input terms is equivalent to negating zero of them (more generally, negating any even number of terms is equivalent to negating any other even number of terms; and likewise for odd numbers of terms). If one of the input terms needs to be negated, this can be achieved by negating the output of the XOR operation, which can be done either in the next logic level or in the output selection logic circuit (further described below).

Table 5 below shows the number of literals and terms with respect to the L1–L3 logic levels according to the described embodiment.

TABLE 5

| Level | Literals | Terms |
|-------|----------|-------|
| L1    | 4        | 16    |
| L2    | 8        | 8     |
| L3    | 16       | 4     |

Figure 12:
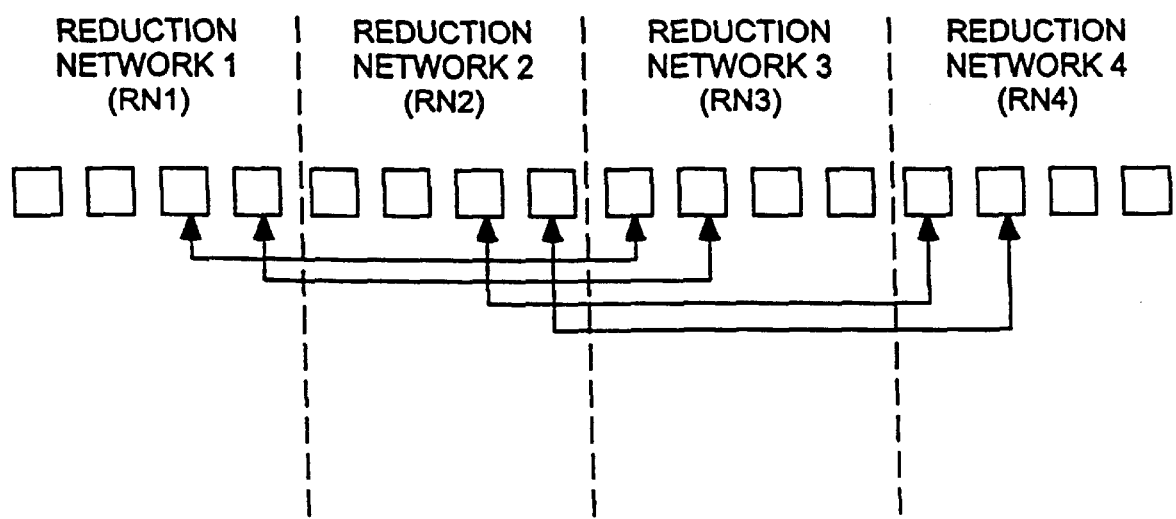
FIG. 12 illustrates another exemplary transposition option.

FIG. 12 illustrates another exemplary transposition option. FIG. 12 follows the same labeling as FIGS. 5D and 5E. Similar to FIG. 5E, FIG. 12 shows a 2×2 matrix transposition between four adjacent reduction networks. However, while in FIG. 5E reduction networks 1, 2, 3, and 4 are respectively providing rows 1, 3, 2 and 4 of the matrix; in FIG. 12 reduction networks 1, 2, 3, and 4 are respectively providing rows 1, 2, 3 and 4 of the matrix.

Figure 13:
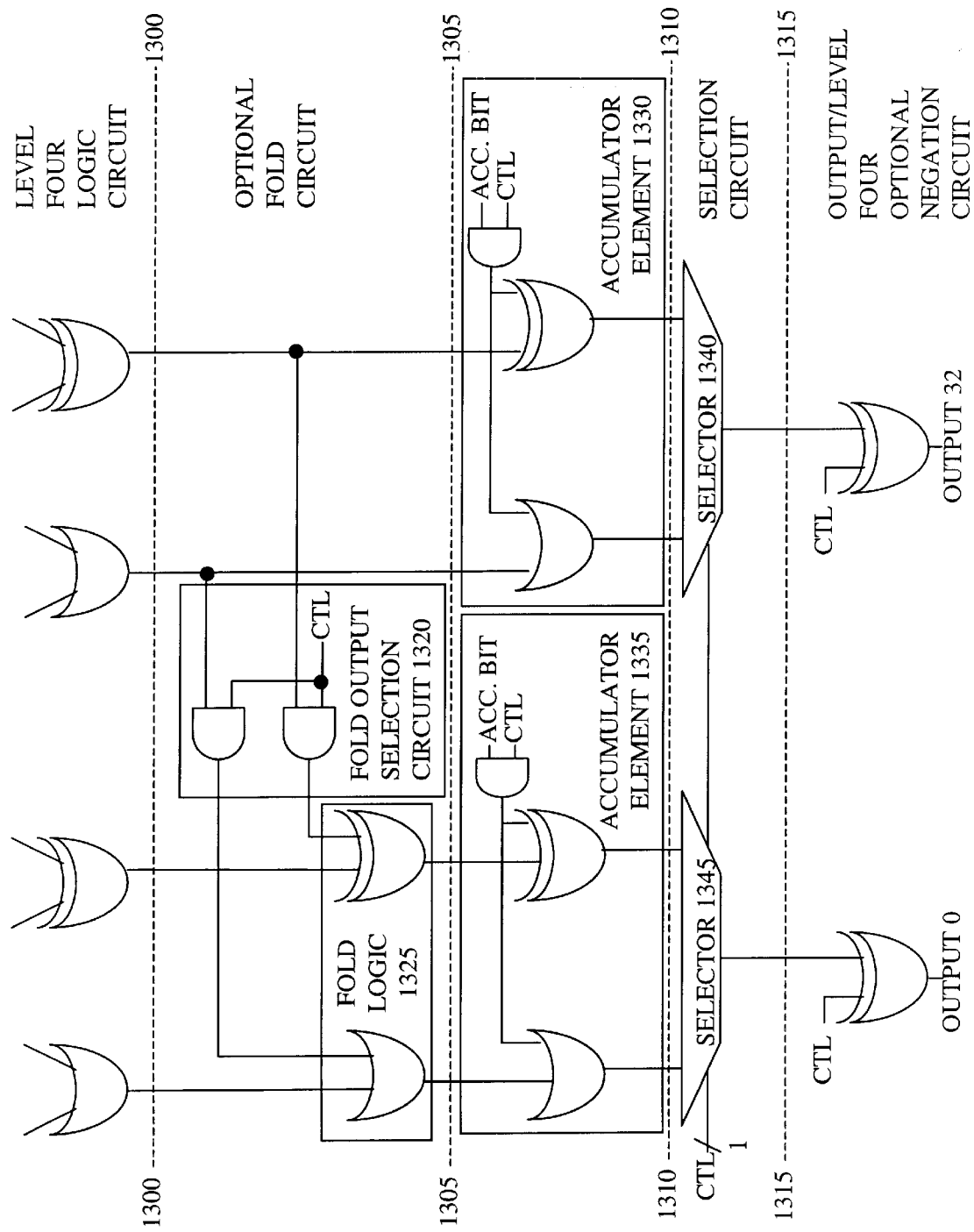
FIG. 13 is a schematic diagram illustrating parts of the L4 logic level and the output selection logic circuit of FIG. 9 according to one embodiment of the invention.

FIG. 13 is a schematic diagram illustrating parts of the L4 logic level and the output selection logic circuit of FIG. 9 according to one embodiment of the invention. Table 6 below labels the circuitry with respect to the dashed lines in FIG. 13.

TABLE 6

| Dashed Lines | Circuitry From |
|--------------|----------------|
| Above 1300 | Level Four Logic Circuit 922 |
| Between 1300 and 1305 | Optional Fold Circuit |
| Between 1305 and 1310 | Accumulator |
| Between 1310 and 1315 | Selection Circuit |
| Below 1315 | Output/Level Four Optional Negation Circuit |

In FIG. 13, a fold output selection circuit 1320 and a fold logic 1325 make up the optional fold circuit and operate in a manner similar to the optional fold circuit of FIG. 5F, with the exception that OR and XOR gates are used instead of AND, OR, and XOR gates. The pair of output bits from the upper term of the level four logic circuit are fed into a fold output selection circuit 1320 and an accumulator element 1335. The output of the fold output selection circuit 1320 is provided to an accumulator element 1335 along with the pair of output bits from the lower term of the level four logic circuit. The output of the fold logic 1325 is fed to an accumulator element 1335.

Each of the accumulator elements allows the output of the programmable logic datapath from the previous cycle to be logically combined with the output of the current cycle. In the embodiment of FIG. 13, each of the accumulator elements 1330 and 1335 includes: 1) an AND gate for receiving an accumulation bit and a control bit for selectively controlling whether an accumulation is performed; and 2) OR and XOR gates for logically combining the pair of output bits received from the optional fold circuit with the accumulation bit.

The pair of bits output by each of the accumulator elements 1330 and 1335 are respectively provided to a selector 1340 and 1345. The selectors 1340 and 1345 provide a similar function to that of the selectors 524 and 522, with the exception that the selectors 1340 and 1345 receive only two inputs and therefore require only one control bit. The outputs of the selectors 1340 and 1345 are provided to output/level four optional negation circuitry similar to the outputs of selectors 522 and 524.

In summary, each reduction network can perform single or multilevel logic operations. For example, each reduction network may be thought of as a single level 64-bit wide logic gate that can be controlled to be either in an AND gate, an OR gate, or an XOR gate. Any subset of the 64 reduction network input bits may be fed to each of these gates in a given reduction network. Abstractly, then, a given reduction network can compute any single term from 64 input literals over AND, OR, and XOR (note: AND and OR can be obtained from a single reduction network of OR gates, plus appropriate negation facilities to take advantage of the DeMorgan's law). As another example, each reduction network can perform 2 or more level logic functions, such as AND-OR, AND-XOR, AND-OR-AND, etc. With two-level logic, each reduction network can independently trade-off the number of terms summed against the number of literals in each term. Independently, one can change the sources of the literals for terms so that each reduction network computes multiple terms from the same set of input literals or all terms from different sets of input literals. With regard to the folding logic, each reduction network may be unfolded by two, so that an alternative way to think of the reduction network bank is as 64 reduction network's each having 32 input literals.

The reduction network bank provides 32 or 64 pairs of bits (depending on whether the programmable logic datapath is configured on a particular cycle as 32 folded reduction networks of 64 inputs each, or as 64 unfolded reduction networks of 32 inputs each)—one bit of each pair is the AND/OR tree result, and the other is the XOR result. These bits may be accumulated by (OR or XOR) with the previous output. The programmable logic datapath output is obtained by selecting either the AND/OR tree or the XOR tree.

In one embodiment of the invention consistent with FIGS. 9–13, table 7 shows the control bits used.

TABLE 7

| Circuitry Being Controlled | Number of Control Bits |
|---|---|
| Byte-wise Selector Unit selecting 64 bits optionally from four different sources) | 16 |
| 64-bit cross bar Rearrangement Circuit | 384 |
| 64-bit bit-wise Subset Selection Circuit | 2048 |
| L1–L3 | 128 each (64 for alignment and 64 for optional negation) |
| Transposition | 16 |
| Optional Fold | 1 |
| Optional Accumulate | 64 |
| Output Selection (e.g., selectors 1340 and 1345) | 64 |
| Optional Negation of the Output | 64 |

Summation Unit

Figure 14:
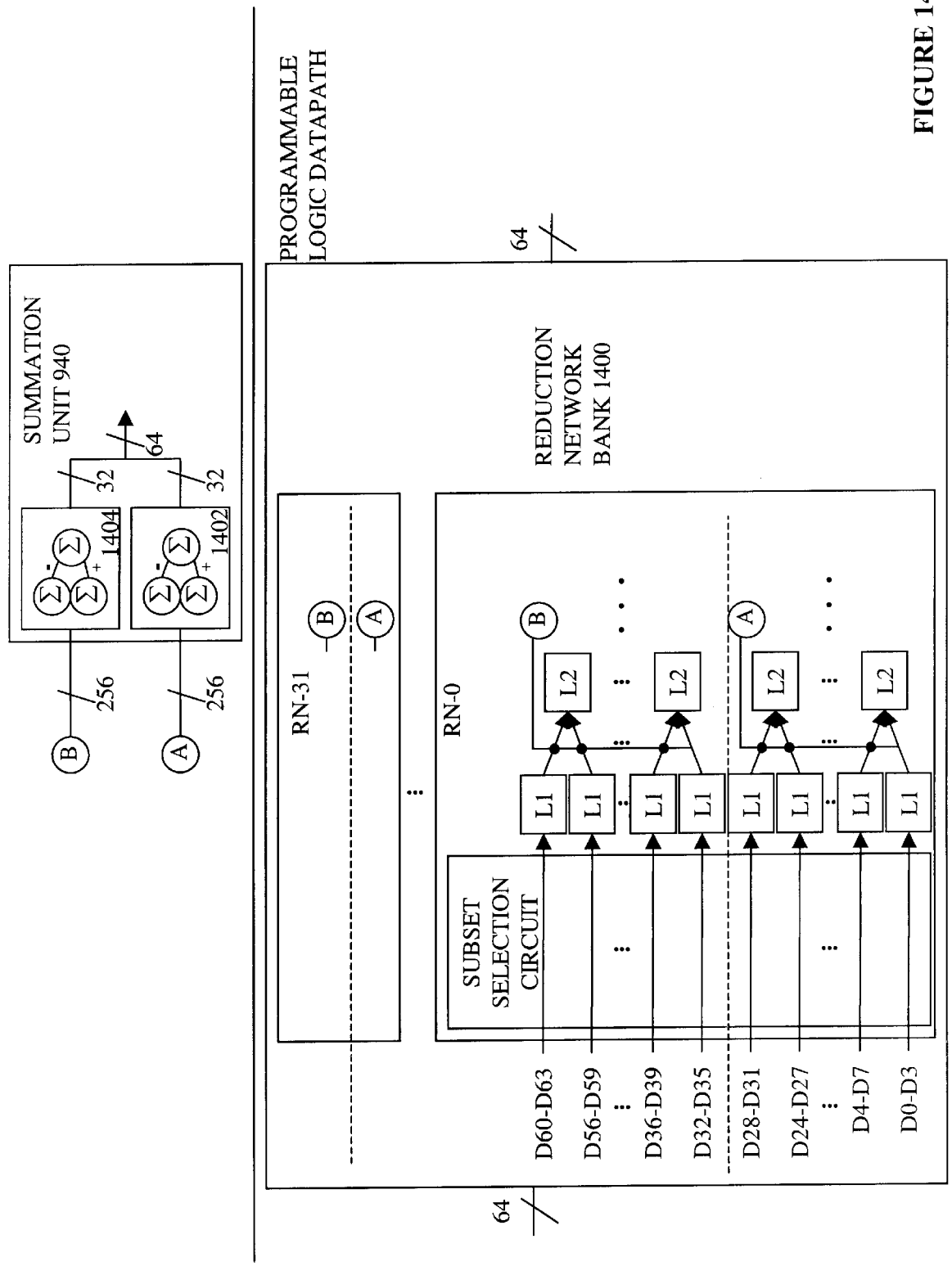
FIG. 14 is a block diagram illustrating a different representation of the coupling of the summation unit of a sums of products datapath to the reduction network bank of the programmable logic datapath of FIGS. 9–13 according to one embodiment of the invention.

FIG. 14 is a block diagram illustrating a different representation of the coupling of the summation unit of the sums of products datapath to the reduction network bank of the programmable logic datapath of FIGS. 9–13 according to one embodiment of the invention. FIG. 14 shows the reduction network bank 1400 from the programmable logic datapath (e.g., the one described in FIGS. 9–13). In FIG. 14, the reduction network bank 1400 is coupled to 64 inputs and has 64 outputs. In addition, the reduction network bank includes 32 reduction networks labeled RN-0 through RN-31. As previously described, the different numbers of inputs and outputs of the invention is a design choice; Thus, the actual numbers used in FIG. 14 are for exemplary purposes.

In FIG. 14, the subset selection circuitry, the L1 logic level, and the L2 level logic for the reduction networks of reduction network bank 1400 are shown (see FIG. 9). As also previously described, each reduction network can be folded or unfolded. As such, each reduction network has a lower section (in FIG. 14, inputs D0–D31) and an upper section (inputs D32–D63) whose outputs are optionally combined by the fold logic. Since there are 32 reduction networks in FIG. 14, there are 32 lower sections of reduction networks and 32 upper sections of reduction networks.

As in the previously described embodiment, the inputs to the summation unit 940 are provided post the L1 logic level (in particular, from the level one optional negation circuit as illustrated in FIG. 11; of course, as already described, alternative embodiments could take the input from another location in the reduction networks). In FIG. 14, the outputs of the lower section of each of the reduction networks provided to the summation unit 940 are labeled A, while those from the upper sections are labeled B. In the described embodiment in which the reduction in the L1 logic level is four-to-one, each of the upper and lower sections of each reduction network provides 8 bits, for a total of 256 bits from each of the upper and lower sections.

In FIG. 14, the summation unit 940 is shown including two sets of the summation circuits. In particular, the sets of summation circuits 1402 and 1404 are respectively coupled to the outputs labeled A and B from the lower and upper sections of the reduction networks. Each of the sets of summation circuits 1402 and 1404 are designed to operate in a manner similar to the summation circuits in FIG. 1A. Each of the sets of summation circuits 1402 and 1404 provide 32 bits of output which are concatenated into a 64 bit result. Thus, each of the sets of summation circuits 1402 and 1404 provides a separate sum of the products.

As previously described, in one embodiment of the invention that processes 64 bits, two control fields control the byte-wise multiplexers of the selector unit 108 (see FIG. 8), an upper field and a lower field. The upper and lower control fields respectively control the upper and lower 32 input bits to the selector unit. Each of the programmable logic datapath and programmable arithmetic datapath provide 64 output bits; the lower and upper 32 of these output bits are respectively fed to the lower and upper input bits of the selector unit. Similarly, the register banks have two ports; port 1 feeds the lower 32 input bits to the selector unit, while port 2 feeds the upper.

Thus, each of the upper and lower sections of the reduction networks has 32 inputs, and there are 32 of these taking input from the lower 32 outputs of the selector unit, and 32 taking input from the upper 32 outputs of the selector unit. Thus, each half (lower and upper sections of the reduction networks) has 32*32=1024 subset input positions, and after reduction by 4 at the L1 logic level, these 1024 signals have been reduced to 256. These 256 signals are respectively fed to the sets of summation circuits 1402 and 1404, with a fixed significance and sign. Specifically, bits from reduction networks 0–24 are positive, while bits from reduction networks 25–31 are negative (see Table 1).

In one embodiment, the most significant 16 bits from the two 32 bit concatenated parts making up the 64 bit output of the summation unit 940 are selected (e.g., by shifting both of the 32 bits parts and packing them together) in the general purpose datapath 132. In this embodiment, the 32 bit concatenated result output from the general purpose datapath 132 is selectable as a feedback in the upper 32 bits of the selector unit. This facilitates the normal usage pattern where the results must be shifted and packed, while reducing the number of internal wires.

Returning to the example problem from before ($x_0k_0 + x_1k_1 + x_2k_2 + x_3k_3 + x_4k_4$, where $x_i$ is a 6 bit unsigned number and $k_i$ is a 12 bit signed number where $k_0=9$, $k_1=-15$, $k_2=40$, $k_3=892$, $k_4=2047$), it should be noted that the dual sets of summation circuits allow the same or a similar problem to be performed in both the upper and lower sections of the reductions networks simultaneously—this corresponds to ten 6×12 multiplies per cycle. As such, the same problem could be performed with different coefficients in each of the upper and lower sections of reduction networks and their corresponding sets of summation circuits 1402 and 1404.

With particular respect to this exemplary problem, the system of FIG. 14, and Table 3, the positive columns all receive 8 inputs, except for columns 26 and 27. The unconstrained ones can come from any of the 32 post selector unit positions, while column 26 inputs (namely $x_{35}$ and $x_{44}$) must come from post selector unit positions 0–15 and the column 27 input (namely $x_{45}$) must come from post selector unit positions 16–31. The other constraint on these columns is that no more than one input can come from any group of 4;

the data bits must be appropriately "spread out" by the selector unit. The constraints for negative columns are somewhat greater. For example, to map $x_{30}$ into negative column 13, the bit needs to appear at L1 logic level output 0 or 1, i.e., post selector unit bits 0–7. Similarly, bit $x_{31}$, needs to appear at post selector unit bits 8–19, and so on.

Thus, to map this problem to this system, a suitable permutation must be found (possibly including duplications) of the inputs that meets the constraints. Then the correct subset bits are selected to map the permuted inputs into the desired L1 logic level outputs.

Again, this embodiment of the field programmable device is designed so that the sums of products datapath provides good support for constant coefficient sums of products over low precision data, and reasonable support for higher precision data (e.g. up to about 14 bits). On reason for this design choice is that the programmable arithmetic datapath 116 is designed to provide good support for higher precision data. Accordingly, if one of the embodiments of the programmable arithmetic datapath 116 described herein is used, the sums of products datapath can potentially double the multiply bandwidth of the programmable arithmetic datapath 116 for constant coefficient sums of products with 14 bit coefficients; and at the lowest precision data, the sums of products datapath can potentially provide up to about 80 multiplies per cycle, or roughly ten times the best possible multiply bandwidth of the programmable arithmetic datapath. Of course, these numbers are based on the design of only one embodiment of the invention. As such, alternative designs of the invention will have different performance characteristics.

While one embodiment is described in which two separate sets of summation circuits 1402 and 1404 are provided, alternative embodiments of the invention could have different designs. For example, only one of the sets of summation circuits 1402 and 1404 could be provided (in addition, the whole 32 bit result of that set of summation circuits could be fed back). As another example, a single set of summation circuits could be provided, however unlike the set of summation circuits 1402 and 1404, the single set of summation circuits could be large enough to be coupled to both the upper and lower sections of the reduction networks. As another example, while the two separate sets of summation circuits 1402 and 1404 are shown being respectively coupled to the lower and upper sections of the reduction networks, in alternative embodiments of the invention the pattern of coupling the reduction networks to the sets of summation circuits could take any form (the pattern of coupling need not be restricted such that the upper and lower reduction networks are respectively coupled to the sets of summation circuits 1402 and 1404, but that some of the upper and/or lower sections of the reduction networks could respectively be coupled to the opposite set of summation circuits).

Furthermore, while embodiments are described in which the same coupling to the sets of summation circuits is used for all of the reduction networks, alternative embodiments of the invention could use different coupling patterns for different reduction networks. In addition, alternative embodiments of the invention are could include more sets of summation circuits. Where more sets of summation circuits are provided, the coupling pattern of the reduction networks to the sets of summation circuits could take a number of different forms. For example, different reduction networks could be coupled to different sets of summation circuits. As another example, the same intermediate outputs from one or more reduction networks could be provided to more than one of the sets of summation circuits. As such, there are many alternative embodiments that are within the scope of the invention.

Alternative Embodiments

While the invention has been described in terms of several embodiments, those skilled in the art will recognize that the invention is not limited to the embodiments described. In particular, the invention can be practiced in several alternative embodiments that provide a dynamic field programmable logic datapath.

Therefore, it should be understood that the method and apparatus of the invention can be practiced with modification and alteration within the spirit and scope of the appended claims. The description is thus to be regarded as illustrative instead of limiting on the invention.

What is claimed is:

1. An apparatus comprising:
   a plurality of inputs;
   a plurality of generation units each coupled to said plurality of inputs and each including,
      a separate selection circuit coupled to each one of said plurality of inputs to selectively pass the signal provided on that input, and
      a plurality of reduction circuits having inputs coupled to mutually exclusive pluralities of said selection circuits and each having an output;
   a first and second summation circuit coupled to the output of the plurality of reduction circuits in mutually exclusive pluralities of said plurality of generation units; and
   a subtraction circuit coupled to an output of the first and second summation circuit.

2. The apparatus of claim 1 further comprising:
   a decoder; and
   a memory coupled to said plurality of generation units and addressable by said decoder, said memory for storing or having stored therein a plurality of sets of control signals, each set of control signals when applied to said selection circuits causing the reduction circuits and their coupled selection circuits to operate as partial product generators.

3. The apparatus of claim 2, said plurality of inputs to receive separate multiplicands simultaneously provided for multiplication by separate corresponding constant coefficient multipliers, wherein a first set of said sets of control signals represents said constant coefficient multipliers.

4. The apparatus of claim 1 further comprising a rearrangement circuit to selectively couple data provided at the plurality of inputs to different ones of a plurality of rearrangement circuit outputs, each of said plurality of generation units being coupled to said plurality of inputs by being coupled to said plurality of rearrangement circuit outputs.

5. The apparatus of claim 1 further comprising:
   a plurality of sources each providing an output; and
   a selector unit coupled to said plurality of sources and having a plurality of outputs coupled to said plurality of inputs, said selector unit to separately select for each part of its output the corresponding part of the output from one of the plurality of sources.

6. An apparatus comprising:
   a plurality of inputs on which separate multiplicands can be simultaneously provided for multiplication by separate corresponding multipliers, wherein said plurality of inputs are divided into mutually exclusive input groups that each include multiple of said plurality of inputs and that can each carry parts of different ones of the multiplicands;

a plurality of partial product generators coupled to each input group, at least certain of said plurality of partial product generators each to independently select from the coupled input group a selected input providing part of one of the multiplicands, and to selectively provide at an output the selected input based on a corresponding part of the corresponding multiplier;

a first summation circuit coupled to the output of certain of the plurality of partial product generators;

a second summation circuit coupled to the output of others of the plurality of partial product generators; and a subtraction circuit coupled to said first and second summation circuits.

7. The apparatus of claim 6 further comprising:

a decoder; and a memory coupled to said partial product generators and addressable by said decoder, said memory for storing or having stored therein a set of control signals representing the corresponding multipliers in a manner that controls said plurality of partial product generators to provide the partial products for multiplying the multiplicands by the corresponding multipliers.

8. The apparatus of claim 7, wherein the corresponding multipliers are constant coefficients.

9. The apparatus of claim 6 further comprising a rearrangement circuit to selectively couple data provided at the plurality of inputs to different ones of a plurality of rearrangement circuit outputs, each of said plurality of partial product generators being coupled to said plurality of inputs by being coupled to said plurality of rearrangement circuit outputs.

10. The apparatus of claim 6 further comprising:

a plurality of sources each providing an output; and a selector unit coupled to said plurality of sources and having a plurality of outputs coupled to said plurality of inputs, said selector unit to separately select for each part of its output the corresponding part of the output from one of the plurality of sources.

11. An apparatus comprising:

a plurality of inputs to simultaneously receive separate values on different groups of the plurality of inputs;

a plurality of generation units each coupled to said plurality of inputs and each including a plurality of partial product generators, wherein said plurality of inputs of each generation unit are divided into pluralities of inputs that are each coupled to a different one of said plurality of partial product generators such that at least certain of said plurality of partial product generators is coupled to inputs that can simultaneously carry data from different ones of said separate values, and each of said partial product generators to selectively pass data from a selected one of the one or more separate values on its inputs based on control signals;

a first and second summation circuits respectively coupled to the output of the partial product generators of mutually exclusive sets of the plurality of generation units; and a subtraction circuit having inputs coupled to the output of the first and second summation circuits.

12. The apparatus of claim 11 further comprising:

a decoder; and a memory coupled to said partial product generators and addressable by said decoder, said memory for storing or having stored therein a set of control signals representing a separate corresponding multiplier for each separate value in a manner that controls said plurality of partial product generators to provide the partial products for multiplying the separate values by the corresponding multipliers.

13. The apparatus of claim 12, wherein the corresponding multipliers are constant coefficients.

14. The apparatus of claim 11 further comprising a rearrangement circuit to selectively couple data provided at the plurality of inputs to different ones of a plurality of rearrangement circuit outputs, each of said plurality of generation units being coupled to said plurality of inputs through said rearrangement circuit.

15. The apparatus of claim 11 further comprising:

a plurality of sources each providing an output; and a selector unit coupled to said plurality of sources and having a plurality of outputs coupled to said plurality of inputs, said selector unit to separately select for each part of its output the corresponding part of the output from one of the plurality of sources.

16. A machine implemented method comprising:

simultaneously receiving at a plurality of inputs data representing a plurality of multiplicands to be multiplied by a corresponding plurality of multipliers, wherein said plurality of inputs is divided into a plurality of mutually exclusive input groups, at least one of which contains bits from two or more of the plurality of multiplicands;

generating a plurality of duplicates of the data provided on each of the input groups;

from separate ones of said duplicates of data on said input groups, generating a partial product for the multiplication of one of the multiplicands by the corresponding multiplier; and summing the partial products to provide the result of summing the product of each of the plurality of multiplicands by the corresponding multiplier.

17. The method of claim 16, wherein said generating includes the following for at least one of the duplicates of data:

selecting from said duplicate of data an input carrying a bit from one of the plurality of multiplicands; and selectively passing the data on the selected input as said partial product based on said corresponding multiplier.

18. The method of claim 16, wherein said generating includes the following for at least the one input group containing bits from two of more of the plurality of multiplicands:

selecting from said duplicate of data an input carrying a bit from one of the plurality of multiplicands; and selectively passing the data on the selected input as said partial product based on said corresponding multiplier.

19. The method of claim 16 further comprising:

decoding an indirect control vector;

based on said decoded indirect control vector, selecting a plurality of control signals representing the corresponding plurality of multipliers, wherein each bit of the duplicates of data is coupled to a separate selection circuit; and wherein said generating partial products includes, applying at least one of said plurality of control signals to each of said selection circuits to select in different input groups one input carrying a bit from one of the plurality of multiplicands and selectively pass the data on the selected inputs as said partial products based on the corresponding multiplier.

20. The method of claim 16 wherein said summing includes, summing mutually exclusive sets of the partial products to provide a first sum and a second sum; and subtracting the first sum from the second sum to produce the result of summing the product of each of the plurality of multiplicands by the corresponding multiplier.

21. The machine-implemented method of claim 16, preliminarily comprising:

receiving initial data representing said plurality of multiplicands; and rearranging different bits of said initial data before provision to said plurality of inputs.

22. The machine-implemented method of claim 21, wherein said rearranging includes replacing certain bits of said initial data with a duplicate of other bits of said initial data.

23. The machine-implemented method of claim 21, preliminarily comprising:

receiving an output from each of a plurality of sources;

separately selecting for each part of said initial data a corresponding part of the output from one of said plurality of sources.

24. An apparatus comprising:

a programmable logic datapath having a plurality of inputs, said programmable logic datapath including a plurality of reduction networks, each of said plurality of reduction networks including, a subset selection circuit coupled to said plurality of inputs to selectively pass the provided data, and at least two logic levels coupled in series, wherein two dynamic reduction paths are provided through said logic levels that each reduce data provided by said subset selection circuit to one bit, each of the logic levels logically combines one or more mutually exclusive groups of data on one of the dynamic reduction paths by logic operations of a first type, each of the logic levels logically combines corresponding groups of data on the other of the dynamic reduction paths by logic operations of a second type, each of the logic levels separately selectively switches the first and second type logic operation outputs in each corresponding group, each logic level also separately selectively negates the output in each corresponding group along at least one of the dynamic reduction paths; and a first and second summation circuits coupled to different mutually exclusive groups of the plurality of reduction networks to receive the output from between logic levels along one of the dynamic reduction paths; and a subtraction circuit coupled to said first and second summation circuits.

25. The apparatus of claim 24 wherein said programmable logic datapath further comprises:

a rearrangement circuit coupled to the plurality of inputs; and a selective field negation circuit coupled to said rearrangement circuit and each of said plurality of reduction networks.

26. The apparatus of claim 24, wherein said programmable logic datapath further comprises a rearrangement circuit to selectively couple data provided at the plurality of inputs to different ones of a plurality of rearrangement circuit outputs, said plurality of reduction networks coupled to said plurality of inputs through said rearrangement circuit.

27. The apparatus of claim 24, wherein:

separate multiplicands can be simultaneously provided on the plurality of inputs for multiplication by separate corresponding multipliers, wherein said plurality of inputs are divided into mutually exclusive input groups that each include multiple of said plurality of inputs and that can each carry parts of different ones of the multiplicands; and wherein said subset selection circuits of the plurality of reduction networks are controlled to operate on at least certain of the input groups to, independently select from the input group a selected input providing part of one of the multiplicands and to selectively provide the selected input based on a corresponding part of the corresponding multiplier.

28. The apparatus of claim 24, wherein separate multiplicands can be simultaneously provided on the plurality of inputs for multiplication by separate corresponding multipliers, and wherein the subset selection circuit and one or more logic levels prior to the first and second summation circuits are controlled to operate as partial products generators to provide partial products to said first and second summation circuits, wherein said subtraction circuit provides the sums of the products of the multiplicands and corresponding multipliers.

29. The apparatus of claim 24 further comprising:

a decoder; and a memory coupled to said programmable logic datapath and addressable by said decoder, said memory for storing or having stored therein a plurality of sets of control signals, each set of control signals when applied to said programmable logic datapath causing said programmable logic datapath to perform a different function, wherein a first of said set of control signals causes said subset selection circuit and the one or more logic levels prior to said first and second summation circuits to operate as partial product generators.

30. The apparatus of claim 24, wherein each of said plurality of reduction networks also includes:

a transposition circuit to selectively interchange with another reduction network data being routed from one of said logic levels to the next according to the dynamic reduction paths.

31. The apparatus of claim 24, further comprising:

a plurality of sources each providing an output; and a selector unit coupled to said plurality of sources and said plurality of inputs of said programmable logic datapath, said selector unit to separately select for each part of its output the corresponding part of the output from one of the plurality of sources.

32. The apparatus of claim 31 wherein said plurality of sources includes an input array and a register bank.

33. The apparatus of claim 31, wherein the parts selected by said selector unit are bytes.

34. The apparatus of claim 24 further comprising:

a third and fourth summation circuits coupled to different mutually exclusive groups of the plurality of reduction networks to receive the output from between logic levels along one of the dynamic reduction paths; and another subtraction circuit coupled to said third and fourth summation circuits.

35. An apparatus comprising:
a programmable logic datapath including,
a plurality of reduction networks each including,
at least two logic levels coupled together in series including,
a first logic level to group its inputs into mutually exclusive groups, separately perform a first and second logic operations on separate copies of the inputs within each group, and optionally switch the combined results within each group before provision to the next logic level, and
each of the remaining logic levels to combine the groups provided to it from the previous logic level into mutually exclusive super groups, perform the first and second logic operations respectively on the first and second optionally switched combined results of the groups, and optionally switch the inputs in each of the groups before provision to the next logic level,
a subset selection circuit coupled to provide the inputs to said first logic level; and
a first and second summation circuits coupled to mutually exclusive sets of the plurality of reduction networks to receive from the first logic level the result of one of the logic operations from each group; and
a subtraction circuit coupled to said first and second summation circuits.

36. The apparatus of claim 35, wherein said first and second summation circuits receive said results by being coupled to receive one of the optionally switched combined results within each group.

37. The apparatus of claim 35 wherein said programmable logic datapath further comprises:
a rearrangement circuit coupled to receive the inputs to said programmable logic datapath;
a selective field negation circuit coupled to said rearrangement circuit and each of said plurality of reduction networks.

38. The apparatus of claim 35, wherein said programmable logic datapath further comprises a rearrangement circuit to selectively couple its inputs to different ones of a plurality of rearrangement circuit outputs, said first logic level in each of said plurality of reduction networks coupled to said plurality of rearrangement circuit outputs.

39. The apparatus of claim 38, wherein
separate multiplicands can be simultaneously provided on a plurality of inputs of said programmable logic datapath for multiplication by separate corresponding multipliers, wherein said plurality of inputs are divided into mutually exclusive input groups that each include multiple of said plurality of inputs and that can each carry parts of different ones of the multiplicands; and wherein said subset selection circuits of the plurality of reduction networks are controlled to operate on at least certain of the input groups to, independently select from the input group a selected input providing part of one of the multiplicands and to selectively provide the selected input based on a corresponding part of the corresponding multiplier.

40. The apparatus of claim 35 wherein separate multiplicands can be simultaneously provided on a plurality of inputs of said programmable logic datapath for multiplication by separate corresponding multipliers, and wherein the subset selection circuits and said first logic levels are controlled to operate as partial products generators to provide partial products to said first and second summation circuits, wherein said subtraction circuit provides the sums of the products of the multiplicands and corresponding multipliers.

41. The apparatus of claim 35 further comprising:
a decoder; and
a memory coupled to said programmable logic datapath and addressable by said decoder, said memory for storing or having stored therein a plurality of sets of control signals, each set of control signals when applied to said programmable logic datapath causing said programmable logic datapath to perform a different function, wherein a first of said set of control signals causes said subset selection circuits and said first logic levels to operate as partial product generators.

42. The apparatus of claim 35 further comprising:
a plurality of sources each providing an output; and
a selector unit to separately select for each part of its output the corresponding part of the output from one of said plurality of sources, said selector unit coupled to provide its output to each of said plurality of reduction networks.

43. The apparatus of claim 42 wherein said plurality of sources includes an input array and a register bank.

44. The apparatus of claim 42, wherein the parts selected by said selector unit are bytes.

45. The apparatus of claim 35, wherein the first and second logic operations of at least one logic level in each of said plurality of reduction networks are XOR and OR operations along with selective negation according to DeMorgan's Law.

46. The apparatus of claim 35, further comprising:
a third and fourth summation circuits coupled to different mutually exclusive sets of the plurality of reduction networks to receive from the first logic level one of the optionally switched combined results within each group; and
another subtraction circuit coupled to said third and fourth summation circuits.

* * * * *